(12) United States Patent
Lee

(10) Patent No.: US 12,745,544 B2
(45) Date of Patent: Sep. 22, 2026

(54) DISPLAY DEVICE WITH BALANCED LIGHT REFLEXIBILITY

(71) Applicant: SAMSUNG DISPLAY CO., LTD., Yongin-si (KR)

(72) Inventor: Eun Bee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 373 days.

(21) Appl. No.: 18/436,756

(22) Filed: Feb. 8, 2024

(65) Prior Publication Data

US 2024/0284760 A1 Aug. 22, 2024

(30) Foreign Application Priority Data

Feb. 16, 2023 (KR) ........................ 10-2023-0020789

(51) Int. Cl.
*H10K 59/80* (2023.01)
*H10K 59/40* (2023.01)

(52) U.S. Cl.
CPC ........... *H10K 59/873* (2023.02); *H10K 59/40* (2023.02); *H10K 59/8792* (2023.02)

(58) Field of Classification Search
CPC ... H10K 59/873; H10K 59/40; H10K 59/8792
See application file for complete search history.

(56) References Cited

U.S. PATENT DOCUMENTS

| | | | | |
|---|---|---|---|---|
| 10,879,491 | B1 | 12/2020 | Yoo et al. | |
| 11,335,867 | B2 | 5/2022 | Jung et al. | |
| 2020/0313101 | A1* | 10/2020 | Jung | H10K 59/1201 |
| 2021/0191552 | A1* | 6/2021 | Bok | G09G 3/32 |
| 2022/0005878 | A1 | 1/2022 | Lee et al. | |
| 2022/0328606 | A1 | 10/2022 | Ito et al. | |

FOREIGN PATENT DOCUMENTS

| | | | |
|---|---|---|---|
| JP | 7002908 | | 1/2022 |
| KR | 10-2019-0082085 | A | 7/2019 |
| KR | 10-2020-0042071 | A | 4/2020 |
| KR | 10-2020-0115834 | A | 10/2020 |

* cited by examiner

*Primary Examiner* — Robert J Michaud
(74) *Attorney, Agent, or Firm* — F. Chau & Associaties, LLC

(57) ABSTRACT

A display device may include a substrate including a transmission area having a first area in which a through hole is defined, a second area surrounding the first area, and a display area surrounding the transmission area; a display element layer disposed on the substrate in the display area; a dam part provided in the second area of the transmission area, the dam part being spaced apart from the display element layer; a thin film encapsulation layer disposed on the display element layer, the thin film encapsulation layer including a first sloped part having a height which becomes smaller as it approaches the dam part in the second area of the transmission area; and a dummy layer covering the first sloped part of the thin film encapsulation layer in the second area of the transmission area, the dummy layer including an outer edge portion extending into the display area adjacent to the second area.

20 Claims, 15 Drawing Sheets

EA1
TH
PTA(FA)
PXL
DA
SA
IV
IV'
DAM
GRV2
GRV1
DR2
DR1
DR3

TA(NDA): PTA(FA), SA

DISPLAY DEVICE WITH BALANCED LIGHT REFLEXIBILITY

CROSS-REFERENCE TO RELATED APPLICATION

The present application claims priority under 35 U.S.C. § 119(a) to Korean patent application No. 10-2023-0020789 filed on Feb. 16, 2023 in the Korean Intellectual Property Office, the entire disclosure of which is incorporated by reference herein.

FIELD

The present disclosure generally relates to display technology, and more particularly relates to a display device with balanced light reflexibility.

DISCUSSION

As interest in information displays has increased, research and development in display technologies has also increased.

SUMMARY

Embodiments of the present disclosure may provide a multi-function display device having substantially balanced external light reflexibility across various functional areas.

In accordance with an embodiment of the present disclosure, there is provided a display device comprising a substrate including a transmission area having a first area in which a through hole is defined, a second area surrounding the first area, and a display area surrounding the transmission area; a display element layer disposed on the substrate in the display area; a dam part provided in the second area of the transmission area, the dam part being spaced apart from the display element layer; a thin film encapsulation layer disposed on the display element layer, the thin film encapsulation layer including a first sloped part having a height which becomes smaller as it approaches the dam part in the second area of the transmission area; and a dummy layer covering the first sloped part of the thin film encapsulation layer in the second area of the transmission area, the dummy layer including an outer edge portion extending into the display area adjacent to the second area The dummy layer may include a transparent organic material. The dummy layer may have a vortex shape.

The thin film encapsulation layer may include: a first encapsulation layer disposed on the display element layer; a second encapsulation layer disposed on the first encapsulation layer; and a third encapsulation layer disposed on the second encapsulation layer. The second encapsulation layer may be an organic layer, and the first and third encapsulation layers may be inorganic layers. The first sloped part may be formed by the second encapsulation layer.

The first sloped part may include an inner edge portion in contact with the dam part in the second area of the transmission area. The outer edge portion of the dummy layer may be located on the third encapsulation layer of the display area, which is spaced apart from the inner edge portion of the first sloped part at a first distance.

The first distance may be about 2000 μm to about 2500 μm.

The dummy layer may have a thickness which becomes thinner as it approaches the outer edge portion.

The dam part may define an area in which the second encapsulation layer is disposed. The dam part may have an annular shape At least one area of the dummy layer may have a second sloped part having a thickness which becomes thinner as it approaches the outer edge portion.

At least one area of the dummy layer may include at least one embossed or wave-like pattern in a direction toward the outer edge portion.

At least one area of the dummy layer may have a stepped shape in a direction toward the outer edge portion.

The display device may further include a touch sensor layer disposed on the dummy layer. The touch sensor layer may include: a base layer disposed on the thin film encapsulation layer in the display area and the dummy layer in the transmission area; a first conductive pattern disposed on the base layer; a first touch insulating layer disposed over the first conductive pattern; a second conductive pattern disposed on the first touch insulating layer; and a second touch insulating layer disposed over the second conductive pattern.

The display device may further include: an optical layer disposed on the touch sensor layer; a window disposed on the optical layer, and a light blocking pattern disposed on the bottom of the window in the second area of the transmission area, the light blocking pattern overlapping the dam part and the dummy layer. The light blocking pattern may include a black matrix.

The display device may further include a pixel circuit layer disposed between the substrate and the display element layer. The pixel circuit layer may include first, second, third, fourth, and fifth insulating layers sequentially disposed on the substrate, at least one transistor disposed on the first insulating layer, and signal lines electrically connected to the transistor. The display element layer may include a pixel defining layer disposed on the pixel circuit layer and a light-emitting element which is disposed on the pixel circuit layer and is electrically connected to the transistor.

The dam part may include at least one of the first insulating layer, the second insulating layer, the third insulating layer, the fourth insulating layer, the fifth insulating layer, and the pixel defining layer.

The light-emitting element may include: a first electrode disposed on the pixel circuit layer, the first electrode having a portion exposed by an opening of the pixel defining layer; a light-emitting layer disposed on the first electrode; and a second electrode disposed on the light-emitting layer.

The display device may include a groove concavely recessed toward the substrate, corresponding to the transmission area.

The display device may further include a sensor part overlapping the through hole of the transmission area.

In accordance with an embodiment of the present disclosure, there is provided a display device comprising: a display panel; a touch sensor layer disposed on the display panel; and a window disposed on the touch sensor layer, wherein the display panel includes: a substrate including a transmission area including a first area in which a through hole is defined and a second area surrounding the first area, and a display area surrounding the transmission area; a display element layer provided on the substrate in the display area, the display element layer including a light-emitting element; a dam part provided in the second area of the transmission area, the dam part being spaced apart from the display element layer; a thin film encapsulation layer disposed on the display element layer, the thin film encapsulation layer having a sloped part having a height which becomes smaller as it approaches the dam part in the second area of the transmission area; and a dummy layer covering the sloped part of the thin film encapsulation layer in the second area of the transmission area, the dummy layer including an outer edge portion located in the display area adjacent to the second area, wherein the sloped part includes an inner edge portion in contact with the dam part in the second area of the transmission area, and wherein the outer edge portion of the dummy layer is located on the thin film encapsulation layer of the display area, which is spaced apart from the inner edge portion of the sloped part at a first distance.

The sloped part may include an inner edge portion in contact with the dam part in the second area of the transmission area. The outer edge portion of the dummy layer may be located on the thin film encapsulation layer of the display area, which is spaced apart from the inner edge portion of the sloped part at a first distance.

The first distance may be about 2000 μm to about 2500 μm.

The thin film encapsulation layer may include: a first encapsulation layer disposed on the display element layer; a second encapsulation layer disposed on the first encapsulation layer; and a third encapsulation layer disposed on the second encapsulation layer. The second encapsulation layer may be an organic layer, and the first and third encapsulation layers may be inorganic layers. The sloped part may be formed by the second encapsulation layer.

BRIEF DESCRIPTION OF THE DRAWINGS

Illustrative embodiments will be described more fully hereinafter with reference to the accompanying drawings, in which:

FIG. 7 is a schematic circuit diagram illustrating an electrical connection relationship of components included in each of pixels shown in FIG. 6.

FIG. 10 is a schematic enlarged view diagram illustrating portion EA1 shown in FIG. 3.

DETAILED DESCRIPTION

Figure 1:
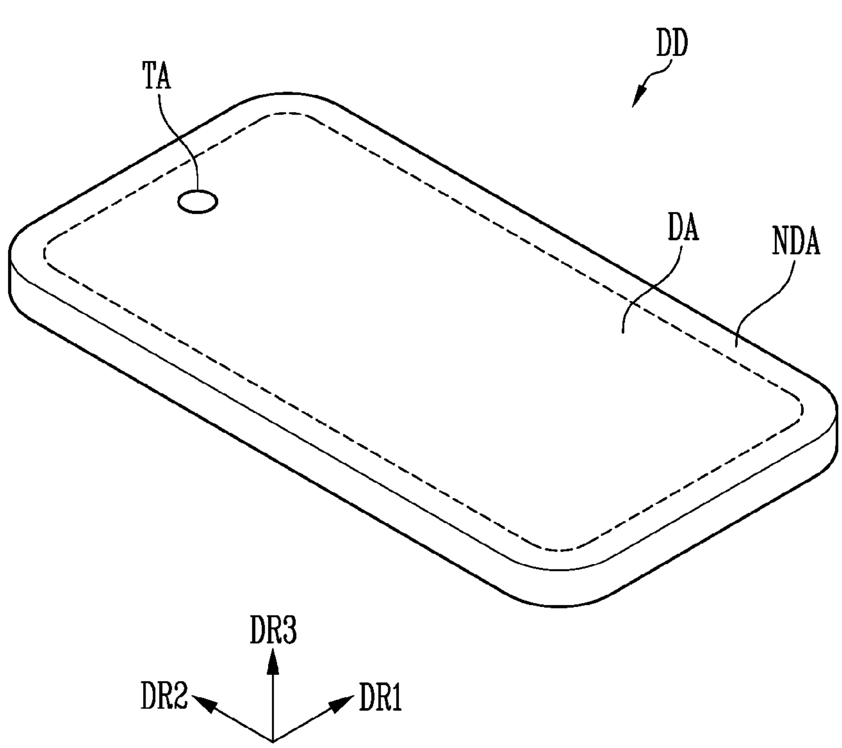
FIG. 1 is a schematic perspective view diagram illustrating a display device in accordance with an embodiment of the present disclosure.

The inventive concept will be described by way of example with reference to illustrative embodiments thereof. Illustrative embodiments of the present disclosure may provide a multi-function display device having substantially balanced external light reflexibility across various functional areas.

Although the inventive concept is described by way of example, it may be embodied in various forms and shall not be construed as limited to the illustrative embodiments set forth herein. Rather, these embodiments are provided so that this disclosure will be thorough and complete, and may fully convey the scope of the inventive concept to those skilled in the art.

The attached drawings may be illustrated in a fashion where figures are expanded for ease of understanding. Moreover, dimensions may be exaggerated for clarity of illustration. For example, the thicknesses of certain lines, layers, components, elements or features may be exaggerated for clarity.

Embodiments of the present disclosure may include various changes and have different shapes, and shall not be limited to the details of particular examples. For example, the examples do not limit the inventive concept to certain shapes as illustrated for ease of description, but the inventive concept shall apply to all such changes such as but not limited to equivalent materials and/or replacements thereof.

It shall be understood that, although the terms “first”, “second”, or the like may be used herein to describe various elements, these elements should not be limited by these terms. For example, these terms may be used to distinguish one element from another element. Thus, a “first” element discussed below could also be termed a “second” element without departing from the teachings of the present disclosure. As used herein, the singular forms are intended to include the plural forms as well, unless the context clearly indicates otherwise.

It shall also be understood that the terms “includes” and/or “including,” when used in this specification, specify the presence of stated features, integers, steps, operations, elements, and/or components, but do not preclude the presence and/or addition of one or more other features, integers, steps, operations, elements, components, and/or groups thereof.

It shall be further understood that when an element is referred to as being “between” two elements, it may be the only element between the two elements, or one or more intervening elements may also be present. Further, an expression that an element such as a layer, region, substrate or plate is placed “on” or “above” another element indicates not merely a case where the element is placed “directly on” or “just above” the other element but also a case where a further element is interposed between the element and the other element. On the contrary, an expression that an element such as a layer, region, substrate or plate is placed “beneath” or “below” another element indicates not merely a case where the element is placed “directly beneath” or “just below” the other element but also a case where a further element is interposed between the element and the other element.

Hereinafter, illustrative embodiments of the present disclosure, and non-limiting examples to promote understanding by those skilled in the art, will be described in detail with reference to the accompanying drawings. In the following description, singular forms in the present disclosure are intended to include the plural forms as well, unless the context clearly indicates otherwise. substantially the same or like reference numerals or indicia may refer to substantially the same or like elements. Duplicate description may be omitted.

Figure 2:
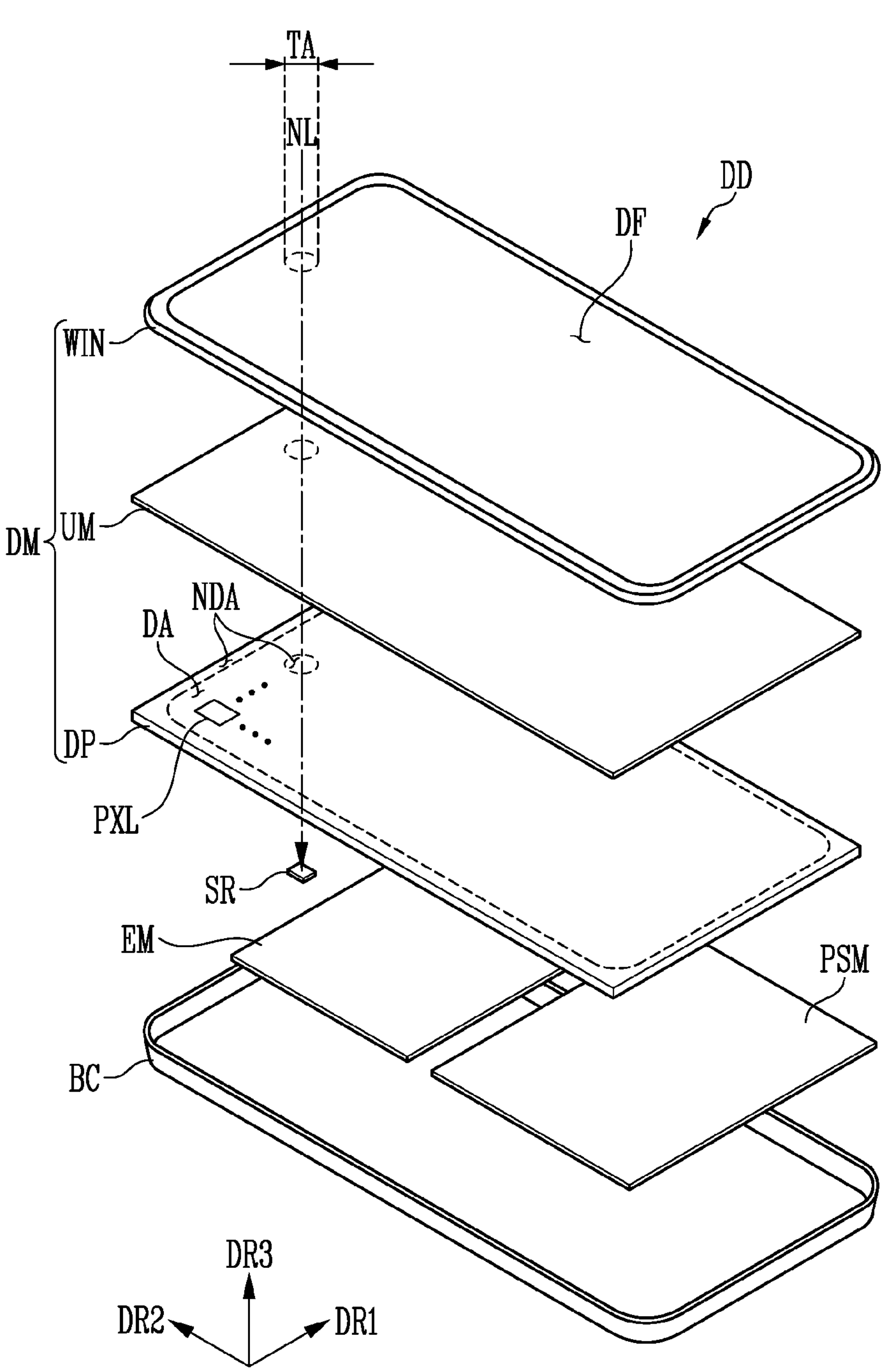
FIG. 2 is a schematic exploded perspective view diagram illustrating the display device in accordance with an embodiment of the present disclosure.

FIG. 1 illustrates a display device DD in accordance with an embodiment of the present disclosure. FIG. 2 illustrates a more detailed example of the display device DD in accordance with an embodiment of the present disclosure.

Referring to FIGS. 1 and 2, the display device DD may display an image through a display surface DF. The display surface DF may be substantially parallel to a surface defined by a first direction DR1 and a second direction DR2. The second direction DR2 may indicate a direction intersecting the first direction DR1. For example, the second direction DR2 may be in a relationship substantially perpendicular to the first direction DR1. A substantially normal direction of the display surface DF, such as a thickness direction of the display device DD, may indicate a third direction DR3. The third direction DR3 may indicate a direction substantially perpendicularly intersecting a plane defined by the first direction DR1 and the second direction DR2. Hereinafter, in this specification, the meaning of "on a plane" or the like may mean a state viewed in the third direction DR3. The display surface DF of the display device DD may correspond to a front surface of the display device DD, and may further correspond to a top surface of a window WIN.

A top surface (or front surface) and a bottom surface (or rear surface) of each of various components (or members) may be defined in a direction in which an image is displayed. The top surface and the bottom surface may be substantially opposite to each other, and a substantially normal direction of each of the top surface and the bottom surface may be substantially parallel to the third direction DR3.

A separation distance between the top surface and the bottom surface in the third direction DR3 may correspond to a thickness of the display device DD in the third direction DR3. Directions indicated by the first to third directions DR1, DR2, and DR3 are relative concepts, and may be changed into or substituted by other directions.

The display device DD may include a display area DA and a non-display area NDA.

The display area DA may have a quadrangular shape substantially parallel to a plane defined by the first direction DR1 and the second direction DR2. However, this is merely illustrative. For example, the display area DA may have various shapes, and is not limited to any particular embodiment thereof. The display area DA may be defined as an area in which an image is displayed. The display device DD may include a plurality of pixels PXL in the display area DA.

The non-display area NDA may be an area in which no image is displayed. The non-display area NDA may be an area surrounding the periphery of the display area DA. The non-display area NDA may entirely surround the display area DA, but the present disclosure is not limited thereto. In an embodiment, the non-display area NDA may be disposed at one side of the display area DA, or be disposed at two sides of the display area DA that face each other in the first direction DR1, or be disposed at three or more sides, without limitation thereto.

At least one of the non-display area NDA or the display area DA may include a transmission area TA. The transmission area TA may be an area capable of transmitting or receiving an optical signal. Although one transmission area TA is exemplarily illustrated in FIGS. 1 and 2, the present disclosure is not limited thereto, and two or more transmission areas TA may be provided. The transmission area TA may be surrounded by the display area DA. The optical signal may include natural light and/or infrared light, and may be generated and/or received in a sensor part SR.

The display device DD may include a display module DM, an electronic module EM, the sensor part SR, a power module PSM, a bottom case BC, and the like.

The display module DM may display an image. The display module DM may include a display panel DP, an upper module UM, and the window WIN.

The display panel DP may display an image. A self-luminescent display panel, such as a Light-Emitting Diode (LED) display panel, a micro-LED or nano-LED display panel using a micro-LED or nano-LED as a light-emitting element, an Organic Light-Emitting Diode (OLED) display panel using an organic light-emitting diode as a light-emitting element, or a Quantum Dot Organic Light-emitting Diode (QD OLED) display panel, using a quantum dot and an organic light-emitting diode, may be used as the display panel DP. In addition, a non-self-luminescent display panel, such as a Liquid Crystal Display (LCD) panel, an Electro-Phoretic Display (EPD) panel, or an Electro-Wetting Display (EWD) panel, may be used as the display panel DP. When a non-self-luminescent display panel is used as the display panel DP, the display module DM may include a backlight unit for supplying light to the display panel DP. In an embodiment, the display panel DP may be an organic light-emitting display panel.

The display panel DP may include a display area DA and a non-display area NDA. The display area DA may correspond to the display area DA of the display device DD, and the non-display area NDA may correspond to the non-display area NDA of the display device DD.

Figure 9:
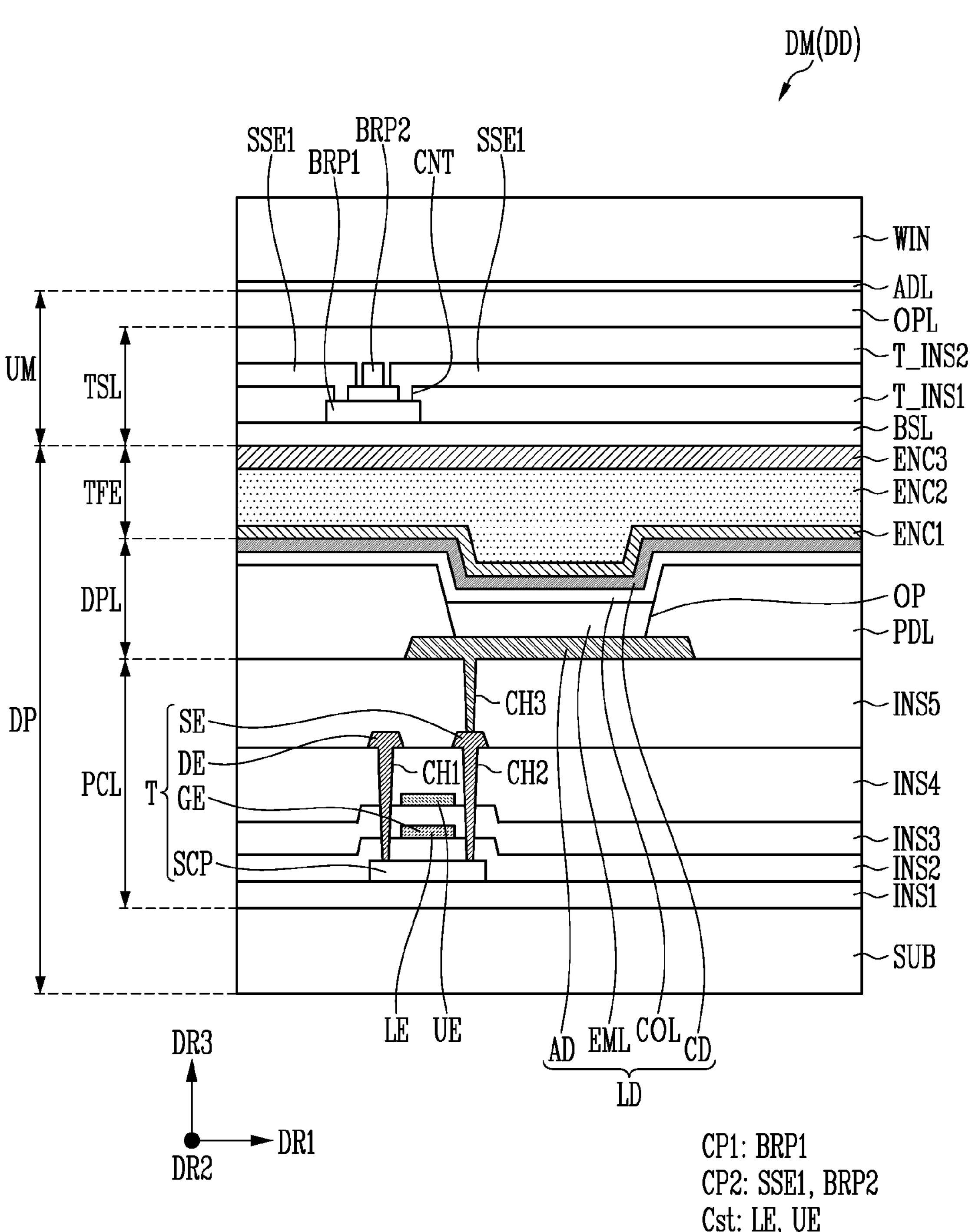
FIG. 9 is a schematic cross-sectional view diagram taken along line III-III' shown in FIG. 8.

The display panel DP may include a plurality of pixels PXL. The pixels PXL may be disposed in the display area DA. Each of the pixels PXL may include a light-emitting element (see "LD" as shown in FIG. 9) emitting visible light such as white light and/or colored light, and a transistor (see "T" as shown in FIG. 9) electrically connected to the light-emitting element. A plurality of pixels PXL may be provided, and may be arranged in a matrix form along pixel rows (or pixel columns) extending in a first direction DR1 and pixel columns (or pixel rows) extending in a second direction DR2 intersecting the first direction DR1. However, the form of arrangement of the pixels PXL is not particularly limited, and the pixels PXL may be arranged in various forms. In an embodiment, when a plurality of pixels PXL are provided, the pixels PXL may be provided in different areas (or sizes). For example, when pixels PXL have different colors of lights emitted therefrom, the pixels PXL may be provided to have different areas (or sizes) or different shapes with respect to the different colors.

The window WIN may provide an outer surface of the display module DM (or the display device DD). The window WIN may include a transparent material through which an image can be output. For example, the window WIN may include glass, sapphire, plastic, and/or the like. Although the window WIN is provided as a single layer, the present disclosure is not limited thereto, and the window WIN may include a plurality of layers. The window WIN may protect the display panel DP from external impact, and provide an input surface and/or the display surface DF to a user. The window WIN may be coupled to the display panel DP by using an adhesive member or the like. The whole or a portion of the window WIN may have flexibility. In an embodiment, the window WIN may include a base substrate, and further include functional layers such as an anti-fingerprint layer.

The display device DD may sense an external input and/or an external pressure according to a configuration of the upper module UM. The upper module UM may include various components (or members).

The electronic module EM may include a control module, a wireless communications module, an image input module, a sound input module, a sound output module, a memory, an external interface module, and the like, which are mounted on a circuit board or are electrically connected to the circuit board through a flexible circuit board. However, the present disclosure is not limited thereto. The electronic module EM may be electrically connected to the power module PSM.

The power module PSM may supply power for overall operations of the display device DD. The power module PSM may include a battery device.

The bottom case BC may be coupled to the display module DM. In an embodiment, the bottom case BC may be particularly coupled to the window WIN to accommodate other components. Although the bottom case BC may be configured with one member as exemplarily illustrated in FIG. 2, the present disclosure is not limited thereto. In an embodiment, the bottom case BC may include two or more parts assembled to each other.

The sensor part SR may be an electronic part for transmitting or receiving an optical signal. The sensor part SR may transmit or receive an optical signal through a partial area of the display device DD, which corresponds to the transmission area TA. For example, the sensor part SR may include a camera module. The camera module may receive natural light NL through the transmission area TA, thereby photographing an external image. The sensor part SR may further include a proximity sensor and/or an infrared light-emitting sensor.

The sensor part SR may be disposed at a lower side of the display module DM. The sensor part SR may overlap the transmission area TA of the display module DM (or the display device DD). The transmission area TA may have a high light transmittance as compared with another area, such as the display area DA. Light, such as the natural light NL, reaches the sensor part SR through the transmission area TA, so that the display device DD can photograph a subject. When the transmission area TA is disposed in the display area DA, the non-display area NDA of the display device DD may be minimized. Thus, the size of a bezel of the display device DD can be reduced, and the display area DA can be provided with optimized width.

Figure 3:
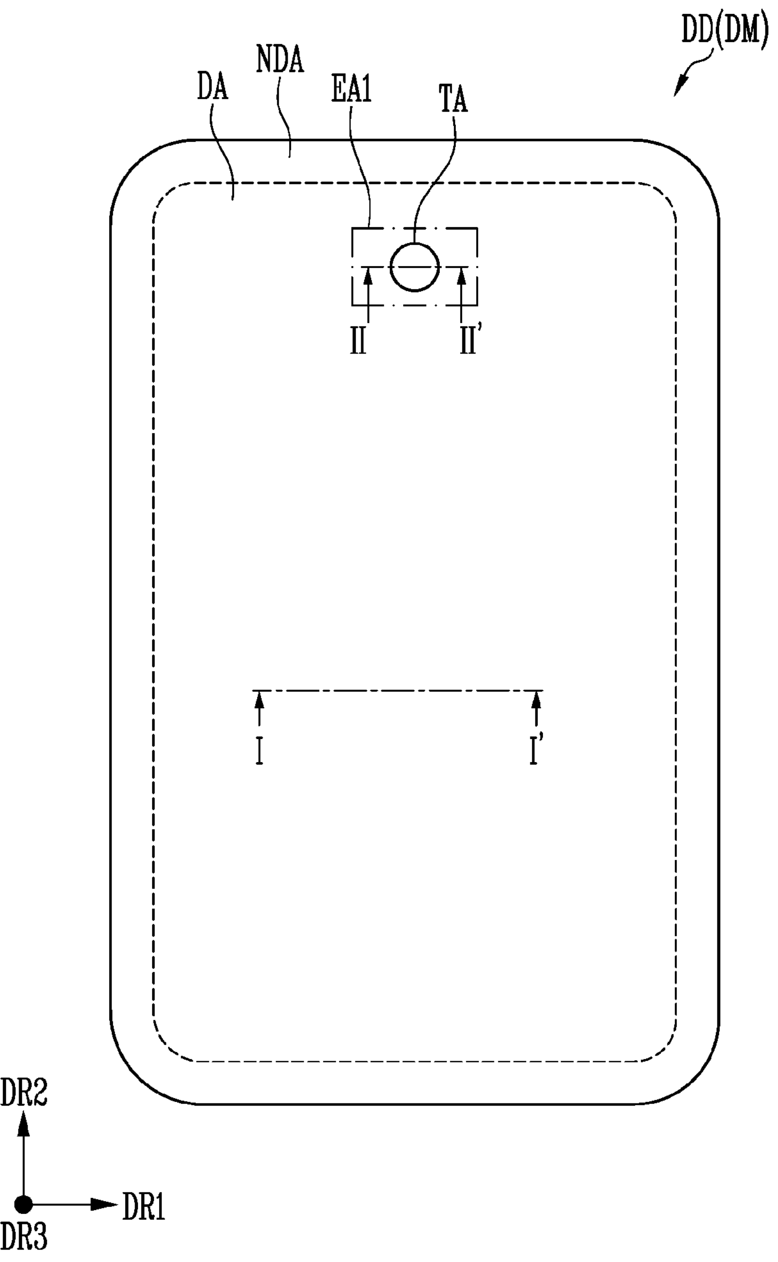
FIG. 3 is a schematic plan view diagram illustrating the display device in accordance with an embodiment of the present disclosure.
Figure 4:
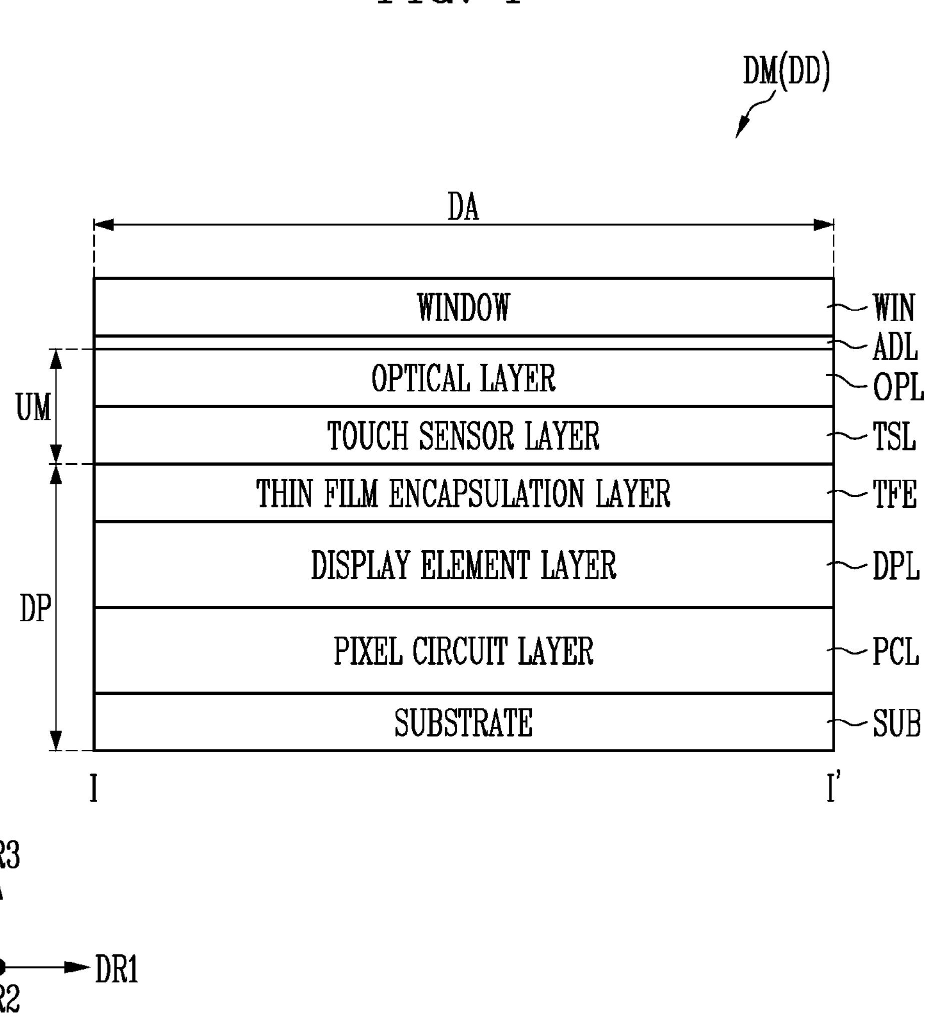
FIG. 4 is a schematic cross-sectional view diagram taken along line I-I' shown in FIG. 3.
Figure 5:
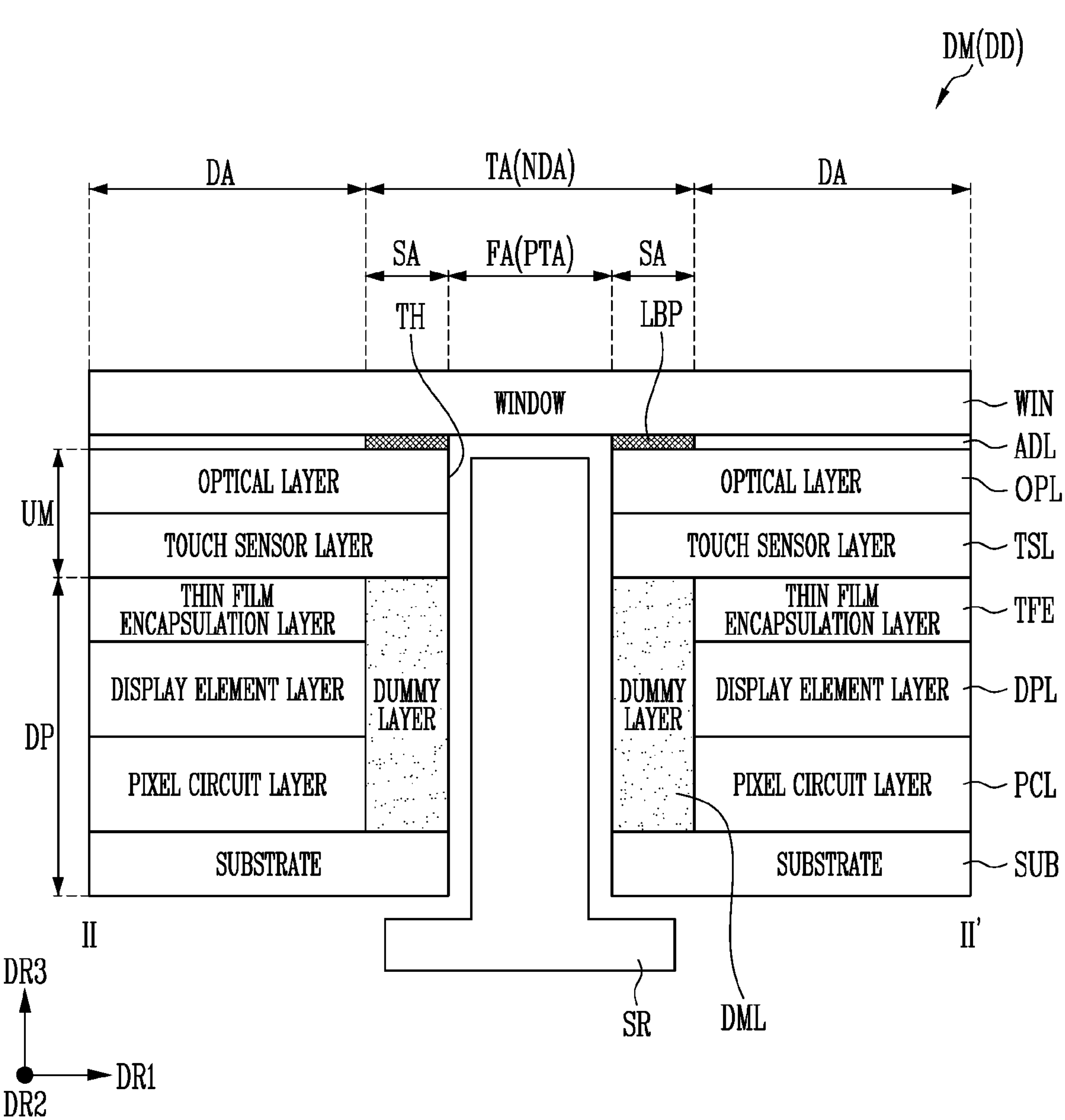
FIG. 5 is a cross-schematic sectional view diagram taken along line II-II' shown in FIG. 3.

FIG. 3 illustrates a display device in accordance with an embodiment of the present disclosure. FIG. 4 illustrates a cross-sectional view taken along line I-I' shown in FIG. 3. FIG. 5 illustrates a cross-sectional view taken along line II-II' shown in FIG. 3.

Referring to FIGS. 1 through 5, the display module DM (or the display device DD) may include a display area DA in which an image is displayed, and a non-display area NDA in which no image is displayed and that surrounds at least one side of the display area DA. Moreover, the display module DM may include a transmission area TA which is located in the display area DA and overlaps the sensor part SR. In an embodiment, the transmission area TA is an area in which no image is displayed, and may be an area of the non-display area NDA.

The display module DM may include a display panel DP, an upper module UM, an adhesive layer ADL, and a window WIN.

The display panel DP may include a substrate SUB in which the display area DA, the transmission area TA, and the non-display area NDA are defined, a pixel circuit layer PCL disposed on the substrate SUB, a display element layer DPL disposed on the pixel circuit layer PCL, and a thin film encapsulation layer TFE (or encapsulation layer) disposed on the display element layer DPL.

The substrate SUB may be a rigid substrate and/or a flexible substrate, without limitation thereto.

The rigid substrate may be, for example, one of a glass substrate, a quartz substrate, a glass ceramic substrate, and/or a crystalline glass substrate.

The flexible substrate may be one of a film substrate and/or a plastic substrate, which include a polymer organic material. For example, the flexible substrate may include a polymer, high-temperature thermoplastic, synthetic fiber, or the like, such as at least one of polystyrene, polyvinyl alcohol, polymethyl methacrylate, polyether-sulfone, polyacrylate, polyetherimide, polyethylene naphthalate, polyethylene terephthalate, polyphenylene sulfide, polyacrylate, polyimide, polycarbonate, triacetate cellulose, cellulose acetate propionate, and/or a combination thereof, without limitation thereto.

The pixel circuit layer PCL may be provided on the substrate SUB, and include a transistor and signal lines connected to the transistor. The transistor may have, for example, a form in which a semiconductor pattern (or active pattern), a gate electrode, a source electrode, and a drain electrode are sequentially stacked with an insulating layer interposed therebetween. The semiconductor pattern may include amorphous silicon, poly-silicon, low temperature poly-silicon, an organic semiconductor, and/or an oxide semiconductor. The gate electrode, the source electrode, and the drain electrode may include one of aluminum (Al), copper (Cu), titanium (Ti), and molybdenum (Mo), but the present disclosure is not limited thereto. Moreover, the pixel circuit layer PCL may include at least one insulating layer.

The display element layer DPL may be disposed on the pixel circuit layer PCL. The display element layer DPL may include a light-emitting element configured for emitting light. The light-emitting element may be, for example, an organic light-emitting diode (OLED), but the present disclosure is not limited thereto. In an embodiment, the light-emitting element may be an inorganic light-emitting element including an inorganic light-emitting material or a light-emitting element configured for emitting light by changing a wavelength of light emitted, such as by using a quantum dot.

The thin film encapsulation layer TFE may be selectively disposed on the display element layer DPL. The thin film encapsulation layer TFE may be an encapsulation substrate or have the form of an encapsulation film provided as a multi-layer stack. When the thin film encapsulation layer TFE has the form of the encapsulation film, the thin film encapsulation layer TFE may include an inorganic layer and/or an organic layer. For example, the thin film encapsulation layer TFE may have a form in which an inorganic layer, an organic layer, and another inorganic layer are sequentially stacked. The thin film encapsulation layer TFE may substantially prevent external air and moisture from infiltrating the display element layer DPL and the pixel circuit layer PCL from the outside.

The upper module UM may include a touch sensor layer TSL disposed on the display panel DP and an optical layer OPL disposed on the touch sensor layer TSL.

The touch sensor layer TSL may be directly disposed on a top surface of the display panel DP. Here, the indication that the touch sensor layer TSL may be "directly disposed" on the top surface of the display panel DP may mean that any separate adhesive layer or any separate adhesive member need not be disposed between the display panel DP and the touch sensor layer TSL. The touch sensor layer TSL may be formed on the thin film encapsulation layer TFE of the display panel DP through a continuous process or using an on-cell method. In greater detail, the touch sensor layer TSL may be formed by patterning sensing electrodes on the thin film encapsulation layer TFE. The touch sensor layer TSL may sense a touch of a user or recognize a fingerprint of the user, without limitation thereto.

The optical layer OPL may be disposed on the touch sensor layer TSL, and may include an anti-reflection layer. The anti-reflection layer may decrease reflexibility of external light incident upon a top side of the window WIN. The anti-reflection layer may include a phase retarder, a polarizer, and the like. The phase retarder may be of a film type or a liquid crystal coating type, and include a λ phase retarder. The polarizer may also be of a film type or a liquid crystal coating type. The film type may include a stretched synthetic resin film, and the liquid crystal coating type may include liquid crystals arranged in a predetermined arrangement. Moreover, the phase retarder and the polarizer may be implemented as one polarizing film. The anti-reflection layer may further include a protective film disposed on the top and/or the bottom of the polarizing film. In an embodiment, the anti-reflection layer may include a plurality of color filters and a black matrix disposed between the color filters.

The display module DM may further include an adhesive layer ADL. The adhesive layer ADL may be disposed between the window WIN and the upper module UM. The adhesive layer ADL may configure the window WIN and the upper module UM to be coupled to each other. The adhesive layer ADL may include an optically clear adhesive film. However, the present disclosure is not limited thereto, and the adhesive layer ADL may include an ordinary adhesive or an ordinary gluing agent. For example, the adhesive layer ADL may include an Optically Clear Resin (OCR) or a Pressure Sensitive Adhesive (PSA) film.

In an embodiment, the transmission area TA of the display module DM may include a through hole TH. The through hole TH may be defined while penetrating the display panel DP, the upper module UM, and the adhesive layer ADL. The transmission area TA may include a first area FA and a second area SA. The first area FA may be defined as a penetration area PTA overlapping the through hole TH and the sensor part SR, and the second area SA may be defined as the other area except for the first area FA in the transmission area TA. The second area SA may surround the first area FA. As the display module DM includes the through hole TH, the transmittance of a signal received by the sensor part SR or a signal transmitted by the sensor part SR may be optimized.

The through hole TH may overlap the sensor part SR, and at least a portion of the sensor part SR may be inserted into the through hole TH. A separation space may be formed between the through hole TH and the sensor part SR. The separation space may be filled with air or may be filled with an optically transparent adhesive resin or the like.

The sensor part SR may an electronic element. For example, the sensor part SR may be an electronic element using light and/or sound. For example, the electronic element may include a sensor which receives light and uses the light, such as an infrared sensor, a camera which photographs an image by receiving light, a fingerprint sensor which measures a distance by outputting and sensing light or sound or recognizes a fingerprint or the like, a miniature lamp which outputs light, a speaker which outputs sound, and the like. In the case of an electronic element using light, the electronic element may use light having various wavelength ranges, such as visual light, infrared light, ultraviolet light, and/or the like. In an embodiment, the transmission area TA may define an area in which light and/or sound, which is output to the outside from the sensor part SR or is advancing toward the sensor part SR from the outside, can be transmitted therethrough.

The window WIN and/or the adhesive layer ADL may include a light blocking pattern LBP. The light blocking pattern LBP may be disposed corresponding to the second area SA in the transmission area TA. The light blocking pattern LBP need not overlap the first area FA. Moreover, the light blocking pattern LBP need not overlap the through hole TH. The light blocking pattern LBP may have a shape surrounding an edge of the sensor part SR, but the present disclosure is not limited thereto. The light blocking pattern LBP may prevent the sensor part SR from being viewed by a user. The light blocking pattern LBP may include a light blocking material configured for blocking light. In an example, the light blocking pattern LBP may be a black matrix including a black pigment or a black dye. The light blocking pattern LBP may have another color instead of or in addition to a black color. Moreover, the light blocking pattern LBP may include a metal material having a light blocking characteristic.

In an embodiment, the display module DM may include a dummy layer DML disposed corresponding to the second area SA of the transmission area TA. The dummy layer DML may be a step difference compensation member which covers a sloped part of a partial component of the thin film encapsulation layer TFE, and which extends to the inner and outer edges of the second area SA of the transmission area TA in the display area DA, thereby reducing a step difference caused by the sloped part. The dummy layer DML may be configured with a transparent material not to interfere with an advancing path of an optical signal received at the sensor part SR and/or an optical signal transmitted from the sensor part SR. In an example, the dummy layer DML may be an organic layer including a transparent organic material.

For convenience of description, a case where the dummy layer DML is disposed entirely in the second area SA of the transmission area TA has been illustrated in FIG. 5. However, the present disclosure is not limited thereto, and the dummy layer DML may extend to at least one transition area of the display area DA adjacent to the second area SA. Illustrative examples of the dummy layer DML will be described in greater detail further below with reference to FIGS. 11 to 15.

Figure 6:
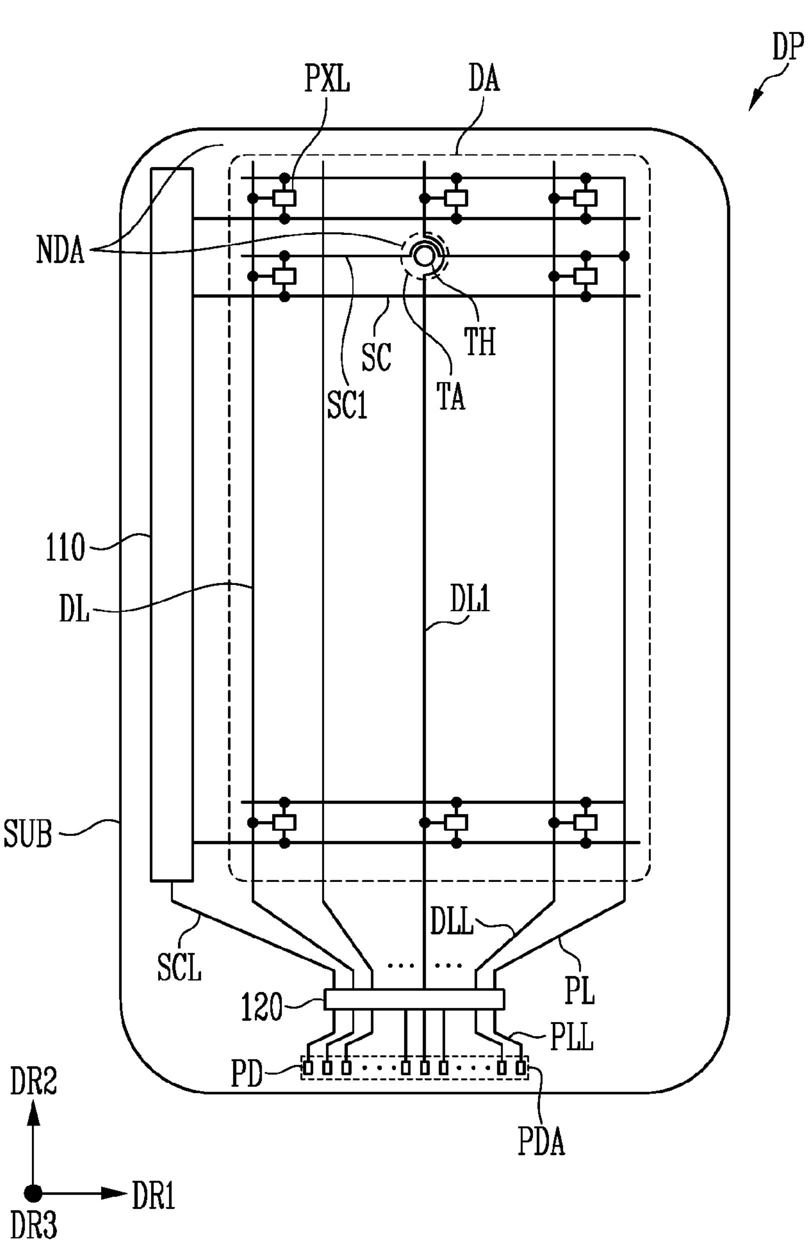
FIG. 6 is a schematic plan view diagram illustrating a display panel included in the display device shown in FIGS. 1 through 3.

FIG. 6 illustrates an embodiment of a display panel DP that may be included in the display device shown in FIGS. 1 through 3.

In this embodiment, for convenience of description, a lateral direction (e.g., an X-axis direction or a horizontal direction) on a plane is indicated as a first direction DR1, a longitudinal direction (e.g., a Y-axis direction or a vertical direction) on the plane is indicated as a second direction DR2, and a longitudinal direction on a section is indicated as a third direction DR3. But embodiments are not limited thereto.

Referring to FIGS. 1 through 6, the display panel DP may include a substrate SUB, pixels PXL, scan lines SC, data lines DL, power lines PL, a scan control line SCL, a scan driver 110, a display driving circuit 120, a display electrode pad PD, data connection lines DLL, and/or pad connection lines PLL.

A display area DA, a non-display area NDA, and a transmission area TA may be defined in the substrate SUB. The transmission area TA may define or overlap a portion of the non-display area NDA that is surrounded by the display area DA, without limitation thereto.

Each of the pixels PXL may include a driving transistor, at least one switching transistor, a light-emitting element, a storage capacitor, and the like. The driving transistor, the at least one switching transistor, and the storage capacitor may be disposed in the pixel circuit layer PCL, and the light-emitting element may be disposed in the display element layer DPL. Each of the pixels PXL may be implemented or emerge as the above-described components are electrically connected to each other in various circuit forms. Each of the pixels PXL may be electrically connected to at least one of the scan lines SC, at least one of the data lines DL, and at least one of the power lines PL. Each of the pixels PXL may overlap the display area DA, and need not overlap the non-display area NDA nor the transmission area TA. However, some insulating layers included in the pixels PXL may overlap a portion of the transmission area TA.

In an embodiment, the scan lines SC may extend in the first direction DR1, and the data lines DL may extend in the second direction DR2. The power lines PL may include at least one line extending in the second direction DR2 and a plurality of lines branching off in the first direction DR1 or the opposite direction of the first direction DR1 from the at least one line.

In addition, among the scan lines SC, a first scan line SC1 passing through the transmission area TA may extend in the first direction DR1 while bypassing a through hole TH and/or an edge of the through hole TH. In addition, among the data lines DL, a first data line DL1 passing through the transmission area TA may extend in the second direction DR2 while bypassing the through hole TH and/or the edge of the through hole TH. The first data line DL1 and the first scan line SC1 may be electrically insulated from each other.

The scan driver 110, the display driving circuit 120, the scan control line SCL, the data connection lines DDL, and the pad connection lines PLL may be disposed while overlapping the non-display area NDA.

The scan driver 110 may apply a scan signal to the scan lines SC in response to a scan control signal supplied from a timing controller. When the scan signal is sequentially supplied to the scan lines SC, the pixels PXL are sequentially selected in units of horizontal lines.

The display driving circuit 120 may be electrically connected through the pad connection line PLL to the display electrode pad PD overlapping a pad area PDA. The pad area PDA may be included in the non-display area NDA. The display driving circuit 120 may supply a data signal to each data line DL through a respective data connection line DLL. Moreover, the display driving circuit 120 may generate the scan control signal for controlling the scan driver 110, and supply the scan control signal to the scan driver 110 through the scan control line SCL. The display driving circuit 120 may include a data driver which supplies a data signal to the data line DL, and may include the timing controller which controls the data driver and the scan driver 110.

In an embodiment, the display driving circuit 120 may be configured as an integrated circuit, to be attached onto the substrate SUB by using a Chip-On-Glass (COG) method, a Chip-On-Plastic (COP) method, an ultrasonic bonding method, or the like.

Figure 7:
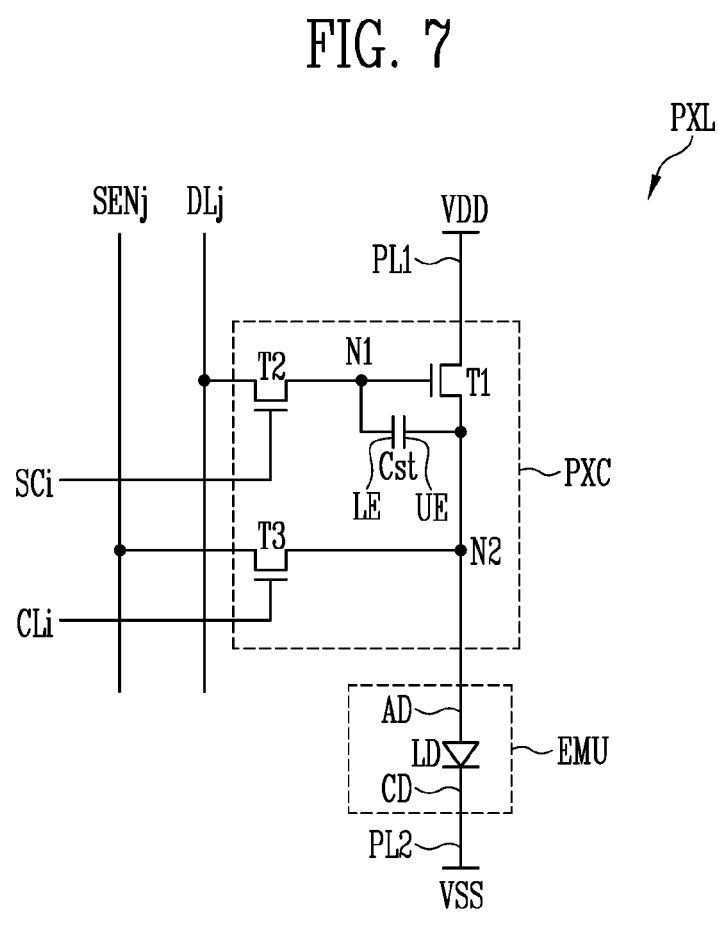

FIG. 7 illustrates an electrical interconnection relationship of components included in each of the pixels shown in FIG. 6.

For convenience of description, a pixel PXL located on an ith pixel row (or ith horizontal line) and a jth pixel column (or jth vertical line) is illustrated in FIG. 7, where i and j are natural numbers.

Referring to FIGS. 1 through 7, the pixel PXL may include a light-emitting component EMU which generates light with a luminance corresponding to a data signal. Moreover, the pixel PXL may further include a pixel circuit PXC for driving the light-emitting component EMU.

The light-emitting component EMU may include a light-emitting element LD electrically connected between a first power line PL1 supplied with a voltage of a first driving power source VDD, and a second power line PL2 supplied with a voltage of a second driving power source VSS. For example, the light-emitting component EMU may include a light-emitting element LD including a first electrode AD electrically connected to the first driving power source VDD via the pixel circuit PXC and the first power line PL1, and a second electrode CD electrically connected to the second driving power source VSS via the second power line PL2. The first electrode AD may be an anode, and the second electrode CD may be a cathode. The first driving power source VDD and the second driving power source VSS may have different electrical potentials or voltages. An electrical potential difference between the first and second driving power sources VDD and VSS may be set equal to or greater than a threshold voltage of the light-emitting element LD during an emission period of the pixel PXL.

In a case where a pixel PXL (or sub-pixel) is located on an ith pixel row and a jth pixel column in the display area DA, a pixel circuit PXC of the pixel PXL may be electrically connected to an ith scan line SCi and a jth data line DLj. Moreover, the pixel circuit PXC may be electrically connected to an ith control line CLi and a jth sensing line SENj.

The above-described pixel circuit PXC may include first to third transistors T1, T2, and T3, and a storage capacitor Cst.

The first transistor T1 is a driving transistor for controlling a driving current to be applied to the light-emitting element LD, and may be electrically connected between the first driving power source VDD and the light-emitting element LD. In greater detail, a first terminal of the first transistor T1 may be electrically connected to the first driving power source VDD through the first power line PL1, a second terminal of the first transistor T1 may be electrically connected to a second node N2, and a gate electrode of the first transistor T1 may be electrically connected to a first node N1. The first transistor T1 may control an amount of driving current applied from the first driving power source VDD to the light-emitting element LD through the second node N2, according to a voltage applied to the first node N1. In an embodiment, the first terminal of the first transistor T1 may be a drain electrode, and the second terminal of the first transistor T1 may be a source electrode. However, the present disclosure is not limited thereto. In an alternate embodiment, the first terminal may be the source electrode, and the second terminal may be the drain electrode.

The second transistor T2 is a switching transistor which selects a pixel PXL in response to a scan signal and activates the pixel PXL, and may be electrically connected between a data line DLj (e.g., the jth data line) and the first node N1. A first terminal of the second transistor T2 may be electrically connected to the data line DLj, a second terminal of the second transistor T2 may be electrically connected to the first node N1 (or the gate electrode of the first transistor T1), and a gate electrode of the second transistor T2 may be electrically connected to a scan line SCi (or the ith scan line).

The first terminal and the second terminal of the second transistor T2 are different terminals. For example, in a case where the first terminal is a drain electrode, the second terminal may be a source electrode.

The second transistor T2 may be turned on when a scan signal having a gate-on voltage (e.g., a relatively high level voltage) is supplied from the scan line SCi, to electrically connect the data line DLj and the first node N1 to each other. The first node N1 is a point at which the second terminal of the second transistor T2 and the gate electrode of the first transistor T1 are connected to each other, and the second transistor T2 may transfer a data signal to the gate electrode of the first transistor T1.

The third transistor T3 may electrically connect the first transistor T1 to a sensing line SENj (e.g., the jth sensing line), to acquire a sensing signal through the sensing line SENj, and detect a characteristic of the pixel PXL, including a threshold voltage of the first transistor T1, and the like, by using the sensing signal. Information on the characteristic of the pixel PXL may be used to convert image data such that a characteristic deviation between pixels PXL can be compensated. A second terminal of the third transistor T3 may be electrically connected to the second terminal of the first transistor T1 at the node N2, a first terminal of the third transistor T3 may be electrically connected to the sensing line SENj, and a gate electrode of the third transistor T3 may be electrically connected to a control line CLi (e.g., the ith control line). The first terminal may be a drain electrode, and the second terminal may be a source electrode.

The third transistor T3 is an initialization transistor capable of initializing the second node N2, and may be turned on when a sensing control signal is supplied from the control line CLi, to transfer a voltage of an initialization power source to the second node N2. Accordingly, the storage capacitor Cst electrically connected between the first node N1 and the second node N2 can be initialized.

The storage capacitor Cst may include a lower electrode LE (or first storage electrode) and an upper electrode UE (or second storage electrode). The lower electrode LE may be electrically connected to the first node N1, and the upper electrode UE may be electrically connected to the second node N2. The storage capacitor Cst charges a data voltage corresponding to a data signal supplied to the first node N1 during one frame period. Accordingly, the storage capacitor Cst can store a voltage corresponding to a difference between a voltage of the gate electrode of the first transistor T1 and a voltage of the second node N2.

Although an embodiment in which the first to third transistors T1, T2, and T3 are each N-type transistors has been disclosed in FIG. 7, the present disclosure is not limited thereto. For example, at least one of the above-described first to third transistors T1, T2, and T3 may be replaced with a P-type transistor.

The structure of the pixel circuit PXC may be variously modified, and embodiments are not limited thereto.

Figure 8:
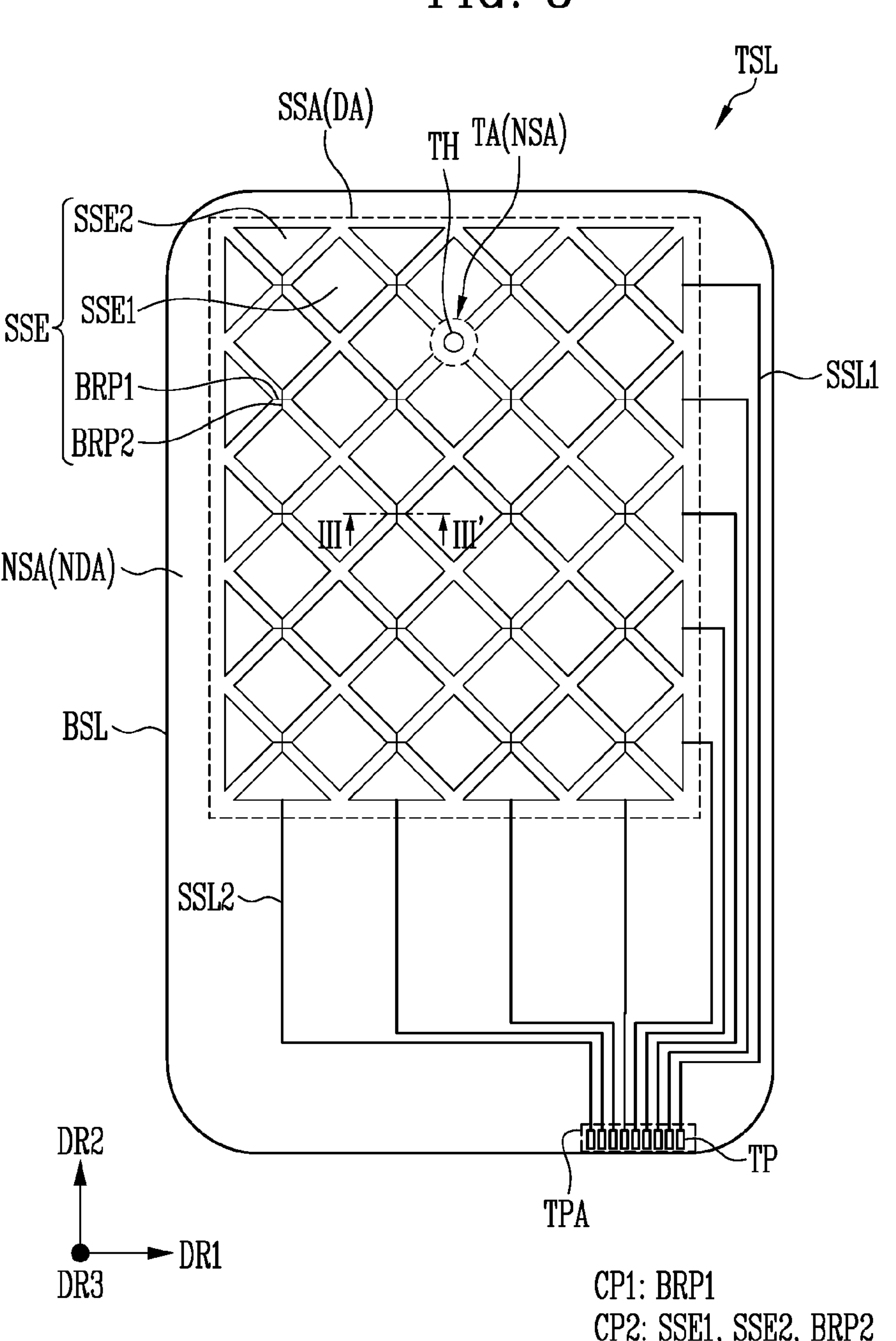
FIG. 8 is a schematic plan view diagram illustrating a touch sensor layer included in the display device shown in FIGS. 1 through 3.

FIG. 8 illustrates a touch sensor layer TSL that may be included in the display device shown in FIGS. 1 through 3.

Referring to FIGS. 1 through 8, the touch sensor layer TSL may include a base layer BSL, sensing electrodes SSE, first sensing lines SSL1, second sensing lines SSL2, and touch pads TP, which are disposed on the base layer BSL.

The base layer BSL may be made of tempered glass, transparent plastic, a transparent film, or the like. In an embodiment, the base layer BSL may be omitted. A sensing area SSA capable of sensing a touch input and a non-sensing area NSA surrounding at least one side of the sensing area SSA may be defined in the base layer BSL. In addition, a transmission area TA may be defined in the base layer BSL. The transmission area TA may define or overlap a portion of the non-sensing area NSA that is surrounded by the sensing area SSA, without limitation thereto.

The sensing area SSA may be provided in a central area of the base layer BSL to overlap the display area DA of the display panel DP. The sensing area SSA may be provided in a shape substantially the same as the shape of the display area DA, but the present disclosure is not limited thereto. The sensing electrodes SSE for sensing a touch input may be provided and/or formed in the sensing area SSA.

The non-sensing area NSA may be provided at an edge of the base layer BSL to overlap the non-display area NDA of the display panel DP, without limitation thereto. The first and second sensing lines SSL1 and SSL2, which may be electrically connected to the sensing electrodes SSE to receive and transfer a sensing signal, may be provided and/or formed in the non-sensing area NSA. In addition, the touch pads TP connected to the first and second sensing lines SSL1 and SSL2, which may be electrically connected to the sensing electrode SSE of the sensing area SSA, may be disposed in the non-sensing area NSA.

The sensing electrodes SSE may include first sensing electrodes SSE1 and second sensing electrodes SSE2. Moreover, the sensing electrodes SSE may include first bridge patterns BRP1 electrically connecting adjacent first sensing electrodes SSE1 to each other, and second bridge patterns BRP2 electrically connecting adjacent second sensing electrodes SSE2 to each other.

The first sensing electrodes SSE1 may be arranged in the first direction DR1, and be electrically connected to adjacent first sensing electrodes SSE1 through the first bridge patterns BRP1, to constitute at least one sensor row. The second sensing electrodes SSE2 may be arranged in the second direction DR2 intersecting the first direction DR1, and be electrically connected to adjacent second sensing electrodes SSE2 through the second bridge patterns BRP2, to constitute at least one sensor column. In an embodiment, the second sensing electrodes SSE2 may be integrally formed with the second bridge patterns BRP2.

Each of the first and second sensing electrodes SSE1 and SSE2 may be electrically connected to one touch pad TP through a corresponding sensing line, namely SSL1 and SSL2, respectively.

The above-described first sensing electrodes SSE1 may correspond to a driving electrode which receives a driving signal for detecting a touch position in the sensing area SSA, and the above-described second sensing electrodes SSE2 may corresponding to a sensing electrode which outputs a sensing signal for detecting a touch position in the sensing area SSA. The present disclosure is not limited thereto.

The touch sensor layer TSL of the upper module UM may sense a variation of mutual capacitance formed between the first and second sensing electrodes SSE1 and SSE2, thereby recognizing a touch of a user.

Each of the first bridge patterns BRP1 is used to electrically connect first sensing electrodes SSE1 adjacently arranged along the first direction DR1, and each first bridge pattern BRP1 may also extend along the first direction DR1.

Each of the second bridge patterns BRP2 is used to electrically connect second sensing electrodes SSE2 adjacently arranged along the second direction DR2, and each second bridge pattern BRP2 may also extend along the second direction DR2.

The touch sensor layer TSL may include a first conductive pattern CP1 provided on the base layer BSL and a second conductive pattern CP2 provided on the first conductive pattern CP1 with a touch insulating layer interposed therebetween. In an embodiment, the first conductive pattern CP1 may include the first bridge patterns BRP1, and the second conductive pattern CP2 may include the first and second sensing electrodes SSE1 and SSE2 and the second bridge patterns BRP2. In an alternate embodiment, the first conductive pattern CP1 may include the first bridge patterns BRP1 and the first sensing electrodes SSE1, and the second conductive pattern CP2 may include the second sensing electrodes SSE2 and the second bridge patterns BRP2.

The first and second sensing lines SSL1 and SSL2 may be disposed in the non-sensing area NSA. The first and second sensing lines SSL1 and SSL2 may be made of a conductive material. The conductive material may include metals, alloys thereof, conductive polymers, conductive metal oxides, nano conductive materials, and the like. In an embodiment, the first and second sensing lines SSL1 and SSL2 may be provided in a double-layer structure including a first metal layer configured with the first conductive pattern CP1 and a second metal layer configured with the second conductive pattern CP2, but the present disclosure is not limited thereto.

The first sensing lines SSL1 may be electrically connected to the first sensing electrodes SSE1. Each first sensing line SSL1 may be electrically connected to one sensor row, respectively formed by a plurality of first sensing electrodes SSE1 disposed along the first direction DR1.

The second sensing lines SSL2 may be electrically connected to the second sensing electrodes SSE2. Each second sensing line SSL2 may be electrically connected to one sensor column, respectively formed by a plurality of second sensing electrodes SSE2 disposed along the second direction DR2.

Each of the first sensing electrodes SSE1 may be supplied with a driving signal for touch sensing through a corresponding first sensing line SSL1, and each of the second sensing electrodes SSE2 may transfer a touch sensing signal through a corresponding second sensing line SSL2. However, the present disclosure is not limited thereto.

The touch pads TP may be electrically connected to an external driving circuit to relay transmission and/or reception of the driving signal and the touch sensing signal with the sensing electrode SSE. The touch pads TP may be disposed in a touch pad area TPA included in the non-sensing area NSA.

The sensing electrodes SSE may overlap the sensing area SSA (or the display area DA), and be disposed not to overlap the transmission area TA. In an embodiment, a light blocking member may be disposed at and/or beyond an outer edge of a through hole TH in the transmission area TA. The transmission area TA may be at least one area of the non-sensing area NSA.

FIG. 9 illustrates a cross-sectional view taken along line III-III' shown in FIG. 8.

In FIG. 9, a display module DM is shown. The display module DM includes a stacked structure (or sectional structure) of an upper module UM including the touch sensor layer TSL shown in FIG. 8. The display module DM further includes a display panel DP located on the bottom of the touch sensor layer TSL.

Hereinafter, a structure of the display module DM is simplified and illustrated, such as that each electrode is illustrated as an electrode having a single layer, and each insulating layer is illustrated as an insulating layer provided as a single layer, but the present disclosure is not limited thereto.

Referring to FIGS. 1 through 9, the display module DM (or the display device DD) may include a display panel DP and an upper module UM. Moreover, the display module DM may include a window WIN located on the upper module UM.

The display panel DP may include a substrate SUB, a pixel circuit layer PCL, a display element layer DPL, and a thin film encapsulation layer TFE.

The substrate SUB may include a transparent insulating material to support light transmission therethrough. The substrate SUB may be a rigid substrate or a flexible substrate.

The pixel circuit layer PCL may be provided and/or formed on the substrate SUB. Circuit elements (e.g., a transistor T) and signal lines electrically connected to the circuit elements may be disposed in the pixel circuit layer PCL. Moreover, the pixel circuit layer PCL may include at least one insulating layer disposed between the circuit elements and the signal lines. For example, the pixel circuit layer PCL may include a first insulating layer INS1, a second insulating layer INS2, a third insulating layer INS3, a fourth insulating layer INS4, and a fifth insulating layer INS5, which are sequentially stacked along the third direction DR3 on the substrate SUB.

The first insulating layer INS1 (or buffer layer) may be entirely disposed on the substrate SUB. The first insulating layer INS1 may prevent an impurity from being diffused into the transistor T. The first insulating layer INS1 may be an inorganic insulating layer including an inorganic material. For example, the first insulating layer INS1 may include at least one of silicon nitride ($SiN_x$), silicon oxide ($SiO_x$), and silicon oxynitride ($SiO_xN_y$), and/or include at least one of metal oxides such as aluminum oxide ($AlO_x$). The first insulating layer INS1 may be provided as a single layer, but may also be provided as a multi-layer stack including at least two layers. In a case where the first insulating layer INS1 is provided as the multi-layer stack, the layers may be formed of substantially the same material or may be formed of different materials. Moreover, the first insulating layer INS1 may be omitted according to a material of the substrate SUB, a process condition, and the like.

The transistor T and a storage capacitor Cst may be disposed on the first insulating layer INS1. The transistor T may be configured substantially the same as the first transistor T1 among the first to third transistors T1, T2, and T3 described with reference to FIG. 7. The storage capacitor Cst may be configured substantially the same as the storage capacitor Cst described with reference to FIG. 7.

The transistor T may include a semiconductor pattern SCP, a gate electrode GE, a source electrode SE, and a drain electrode DE.

The semiconductor pattern SCP may be a semiconductor pattern made of poly-silicon, amorphous silicon, an oxide semiconductor, or the like. The semiconductor pattern SCP may include a source region in contact with the source electrode SE and a drain region in contact with the drain electrode DE. Moreover, the semiconductor pattern SCP may include a channel region which is located between the source region and the drain region and overlaps the gate electrode GE. The channel region may be an intrinsic semiconductor pattern undoped with any impurity, and each of the source and drain regions may be a semiconductor pattern doped with an impurity.

The second insulating layer INS2 may be entirely provided and/or formed on the semiconductor pattern SCP and the first insulating layer INS1*m* without limitation thereto.

The gate electrode GE may be disposed on the channel region of the semiconductor pattern SCP with the second insulating layer INS2 interposed therebetween. The gate electrode GE may include a relatively low resistance material. For example, the gate electrode GE may include a conductive material including molybdenum (Mo), aluminum (Al), copper (Cu), titanium (Ti), and/or the like, and be formed as a multi-layer stack or a single layer, which may include at least one of the above-described materials.

The second insulating layer INS2 (or gate insulating layer) located between the semiconductor pattern SCP and the gate electrode GE may include substantially the same material as the above-described first insulating layer INS1, or it may include a material appropriate (or selected) from the materials exemplified as materials that may constitute the first insulating layer INS1. For example, the second insulating layer INS2 may include an inorganic insulting layer including an inorganic material. In an embodiment, the second insulating layer INS2 may be etched together with a base material of the gate electrode GE in a manufacturing process of the gate electrode GE to be disposed on the bottom of the gate electrode GE. The second insulating layer INS2 may have substantially the same width as the gate electrode GE located on the top thereof, but the present disclosure is not limited thereto.

The third insulating layer INS3 may be disposed on the gate electrode GE and the second insulating layer INS2. The third insulating layer INS3 need not be substantially the same material as the first insulating layer INS1 nor the second insulating layer INS2. In an embodiment, the third insulating layer INS3 may be substantially the same material as the first insulating layer INS1, without limitation thereto.

The fourth insulating layer INS4 may be disposed on the third insulating layer INS3. The fourth insulating layer INS4 need not be substantially the same material as the first insulating layer INS1, the second insulating layer INS2, nor the third insulating layer INS3. In an embodiment, the fourth insulating layer INS4 may be substantially the same material as the second insulating layer INS2, without limitation thereto.

The source electrode SE and the drain electrode DE may include a material having excellent conductivity. For example, the source electrode SE and the drain electrode DE may include a conductive material such as molybdenum (Mo), aluminum (Al), copper (Cu), titanium (Ti), and the like, and be formed as a multi-layer stack or as a single layer, either of which includes the above-described materials. The source electrode SE and the drain electrode DE may be provided and/or formed on the fourth insulating layer INS4. The source electrode SE may be in contact with the source region of the semiconductor pattern SCP through a second contact hole CH2 sequentially penetrating the fourth insulating layer INS4, the third insulating layer INS3, and the second insulating layer INS2. The drain electrode DE may be in contact with the drain region of the semiconductor pattern SCP through a first contact hole CH1 sequentially penetrating the fourth insulating layer INS4, the third insulating layer INS3, and the second insulating layer INS2.

The storage capacitor Cst may include a lower electrode LE and an upper electrode UE, which overlap each other with the third insulating layer INS3 interposed therebetween. The storage capacitor Cst may overlap the transistor T. Although a case where the lower electrode LE of the storage capacitor Cst is integrally formed with the gate electrode GE of the transistor T is illustrated in FIG. 9, the present disclosure is not limited thereto. In an embodiment, the gate electrode GE and the lower electrode LE may be non-integrally formed to be electrically connected to each other through a connection member. The lower electrode LE may be disposed on the second insulating layer INS2. The upper electrode UE may be disposed on the third insulating layer INS3, and be electrically connected to the source electrode SE of the transistor T.

The third insulating layer INS3 (or interlayer insulating layer) located between the lower electrode LE and the upper electrode UE may be entirely provided and/or formed on the gate electrode GE (and/or the lower electrode LE) and the second insulating layer INS2. The third insulating layer INS3 may include substantially the same material as the first insulating layer INS1, or include a material appropriate (or selected) from the materials exemplified as the material constituting the first insulating layer INS1. For example, the third insulating layer INS3 may be an inorganic insulating layer including an inorganic material.

The fourth insulating layer INS4 (or passivation layer) may be entirely provided and/or formed on the third insulating layer INS3 and the upper electrode UE. The fourth insulating layer INS4 may include substantially the same material as the first insulating layer INS1, or include a material appropriate (or selected) from the materials exemplified as the material constituting the first insulating layer INS1. For example, the fourth insulating layer INS4 may be an inorganic insulating layer including an inorganic material, but the present disclosure is not limited thereto.

The second insulating layer INS2, the third insulating layer INS3, and the fourth insulating layer INS4, which are described above, may be partially opened to include the second contact hole CH2 exposing a portion of the source region of the semiconductor pattern SCP. Moreover, the second insulating layer INS2, the third insulating layer INS3, and the fourth insulating layer INS4 may be partially opened to include the first contact hole CH1 exposing a portion of the drain region of the semiconductor pattern SCP.

The fifth insulating layer INS5 (or via layer) may be entirely provided and/or formed on the source and drain electrodes SE and DE, respectively, and the fourth insulating layer INS4. The fifth insulating layer INS5 may be an inorganic insulating layer including an inorganic material, or an organic insulating layer including an organic material. The inorganic insulating layer may include, for example, at least one of silicon nitride ($SiN_x$), silicon oxide ($SiO_x$), silicon oxynitride ($SiO_xN_y$), and aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin. In an embodiment, the fifth insulating layer INS5 may be an organic insulating layer including an organic material. The fifth insulating layer INS5 may be partially opened to include a third contact hole CH3 exposing a portion of the source electrode SE and/or the upper electrode UE which may be electrically connected to the source electrode SE.

The display element layer DPL may be provided and/or formed on the fifth insulating layer INS5. The display element layer DPL may be entirely provided and/or formed on the fifth insulating layer INS5.

The display element layer DPL may include a light-emitting element LD and a pixel defining layer PDL.

The light-emitting element LD may include a first electrode AD, a light-emitting layer EML, and a second electrode CD. Moreover, the light-emitting element LD may selectively include a control layer COL disposed between the light-emitting layer EML and the second electrode CD.

The first electrode AD (or pixel electrode) may be provided and/or formed on the fifth insulating layer INS5. The first electrode AD may be an anode of the light-emitting element LD. The first electrode AD may be electrically connected to the source electrode SE (and/or the upper electrode UE) through the third contact hole CH3. The first electrode AD may include a conductive material (or substance). The conductive material may include an opaque metal. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the material of the first electrode AD is not limited thereto. In an embodiment, the first electrode AD may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), or indium tin zinc oxide (ITZO), a conductive polymer such as poly(3,4-ethylenedioxythiophene (PEDOT), and the like. When the first electrode AD includes a transparent conductive material (or substance), a separate conductive layer may be added, which is made of an opaque metal for reflecting light emitted from the light-emitting layer EML in an image display direction of the display module DM (or an upper direction of the thin film encapsulation layer TFE).

The pixel defining layer PDL may be provided and/or formed over the first electrode AD and on the fifth insulating layer INS5. The pixel defining layer PDL need not be entirely provided and/or formed on the first electrode AD.

The pixel defining layer PDL includes an opening OP exposing a portion of the first electrode AD, and may cover an edge of the first electrode AD. The pixel defining layer PDL may define an emission area of each pixel PXL. The pixel defining layer PDL may include an organic insulating layer made of an organic material. The organic material may include acrylic resin, epoxy resin, phenolic resin, polyamide resin, polyimide resin, and the like. In an embodiment, the pixel defining layer PDL may include a light absorption material or have a light absorber coated thereon, to absorb light introduced from the outside. For example, the pixel defining layer PDL may include a carbon-based black pigment. However, the present disclosure is not limited thereto.

The light-emitting layer EML may be supplied onto an area of the first electrode AD, which is exposed by the opening OP of the pixel defining layer PDL by using an inkjet printing method or the like, but the method of supplying the light-emitting layer EML is not limited thereto. The light-emitting layer EML may include a light generation layer which generates predetermined light and includes a high molecular weight organic material or a low molecular weight organic material. The light-emitting layer EML may be configured with at least one material among materials emitting lights of red, green, and blue, and include a fluorescent material or a phosphorescent material. The light-emitting element EML may emit light in response to a potential difference between the first electrode AD and the second electrode CD.

The control layer COL may be disposed between the first electrode AD and the second electrode CD. The control layer COL may be disposed adjacent to the light-emitting layer EML. The control layer COL controls movement of charges, thereby optimizing the light emission efficiency and operational lifetime of the light-emitting element LD. The control layer COL may include at least one of a hole transport material, a hole injection material, an electron transport material, and an electron injection material. Although a case where the control layer COL is disposed between the light-emitting layer EML and the second electrode CD is illustrated in FIG. 9, the present disclosure is not limited thereto. In an embodiment, the control layer COL may be disposed between the light-emitting layer EML and the first electrode AD, and/or be provided as a plurality of layers stacked along the third direction DR3 with the light-emitting layer EML interposed therebetween. The control layer COL may be commonly provided to the pixels PXL.

The second electrode CD may be provided and/or formed on the control layer COL, the light-emitting layer EML, and/or the pixel defining layer PDL, such as based on the location of the control layer COL. The second electrode CD (or common electrode) may be commonly provided to the pixels PXL. The second electrode CD may be provided in a plate shape throughout the whole of the display area DA, but the present disclosure is not limited thereto. The second electrode CD may be a thin metal layer having a thickness to a degree to which light emitted from the light-emitting layer EML can be transmitted therethrough. The second electrode CD may be formed of a metal material or be formed of a transparent conductive material to have a relatively thin thickness. For example, the second electrode CD may include at least one of various transparent conductive materials including indium tin oxide, indium zinc oxide, indium tin zinc oxide, aluminum zinc oxide, gallium zinc oxide, zinc tin oxide, and gallium tin oxide, or the like, and be formed as substantially transparent or translucent to satisfy a predetermined transmittance. Accordingly, light emitted from the light-emitting layer EML located on the bottom of the second electrode CD can be emitted upwardly from the thin film encapsulating layer TFE while passing through the second electrode CD.

The thin film encapsulation layer TFE may include a first encapsulation layer ENC1, a second encapsulation layer ENC2, and a third encapsulation layer ENC3, which are sequentially located over the second electrode CD. The first encapsulation layer ENC1 may be formed on the display element layer DPL (or the second electrode CD), and be located throughout the display area DA and at least a portion of the non-display area NDA. The second encapsulation layer ENC2 may be formed on the first encapsulation layer ENC1, and be located throughout the display area DA and at least a portion of the non-display area NDA. The third encapsulation layer ENC3 may be formed on the second encapsulation layer ENC2, and be located throughout the display area DA and at least a portion of the non-display area NDA. In an embodiment, at least one of the first, second or third encapsulation layers may be entirely provided and/or formed in the display area DA and the non-display area NDA. For example, the third encapsulation layer ENC3 may be located throughout the whole of the display area DA and the non-display area NDA.

Each of the first and third encapsulation layers ENC1 and ENC3 may be configured as an inorganic layer including an inorganic material, and the second encapsulation layer ENC2 may be configured as an organic layer including an organic material. The inorganic layer may include, for example, silicon nitride ($SiN_x$), silicon oxide ($SiO_x$), silicon oxynitride ($SiO_xN_y$), or the like. The organic layer may include an organic insulating material such as acrylic resin, epoxy resin, phenolic resin, polyamides resin, polyimides resin, polyester resin, poly-phenylene sulfide resin, or benzocyclobutene (BCB).

The upper module UM may be disposed on the display panel DP, the thin film encapsulation layer TFE, and/or the third encapsulation layer ENC3.

The upper module UM may include a touch sensor layer TSL and an optical layer OPL.

The touch sensor layer TSL may include a base layer BSL, a first conductive pattern CP1 (including a first bridge pattern BRP1), a first touch insulating layer T_INS1, a second conductive pattern CP2 (including a second bridge pattern BRP2), and a second touch insulating layer T_INS2.

The base layer BSL (or base insulating layer) may be directly disposed on the display panel DP. For example, the base layer BSL may be in direct contact with the third encapsulation layer ENC3.

The first conductive pattern CP1 may be provided and/or formed on the base layer BSL, and include the first bridge pattern BRP1. The first touch insulating layer T_INS1 may be entirely provided and/or formed on the first conductive pattern CP1 and the base layer BSL. The second conductive pattern CP2 may be provided and/or formed on the first touch insulating layer T_INS1. The second conductive pattern CP2 may include first and second sensing electrodes SSE1 and SSE2 (see, e.g., FIG. 8) and a second bridge pattern BRP2. The second touch insulating layer T_INS2 may be entirely provided and/or formed on the second conductive pattern CP2 and the first touch insulating layer T_INS1 (e.g., the portion of T_INS1 between BRP1 and BRP2). The above-described first and second conductive patterns CP1 and CP2 may include a metal layer or a transparent conductive layer, but the present disclosure is not limited thereto.

Each of the first touch insulating layer T_INS1 (or sensing insulating layer) and the second touch insulating layer T_INS2 (or cover insulating layer) may include an inorganic insulating layer including an inorganic material or an organic insulating layer including an organic material. The inorganic insulating layer may include at least one of aluminum oxide, titanium oxide, silicon oxide, silicon nitride, silicon oxynitride, zirconium oxide, and/or hafnium oxide. The organic insulating layer may include at least one of an acryl-based resin, a methacryl-based and acryl-based resin, a methacryl-based resin, a polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The first touch insulating layer T_INS1 may be partially opened to include a contact part exposing a portion of the first bridge pattern BRP1. First sensing electrodes SSE1 adjacent to each other in the first direction DR1 may be electrically connected to the first bridge pattern BRP1 through the contact part CNT.

The optical layer OPL may be provided and/or formed on the touch sensor layer TSL, such as on the second touch insulating layer T_INS2. The optical layer OPL may include an anti-reflection layer. An adhesive layer ADL may be disposed on the optical layer OPL.

Figure 10:
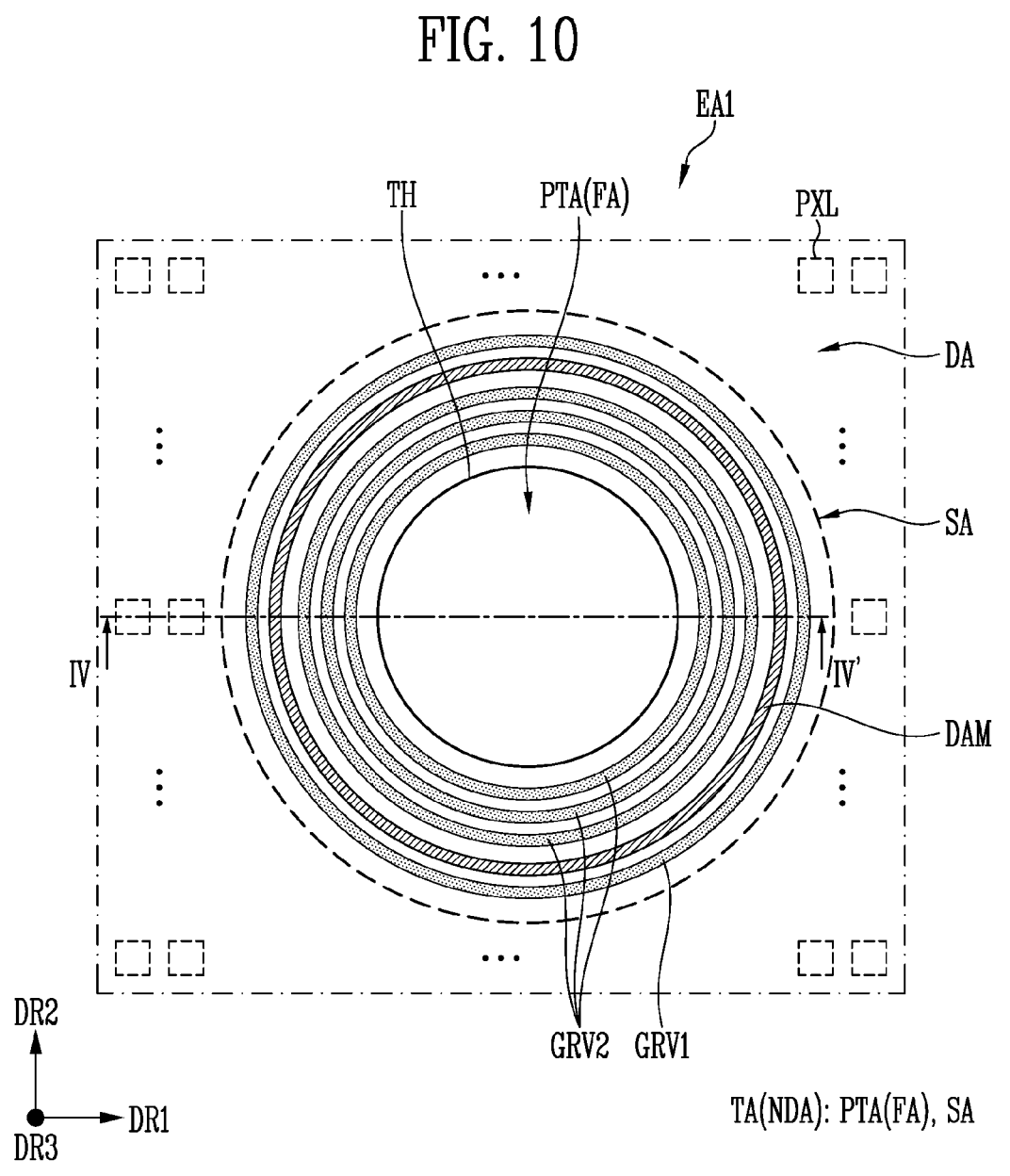

The window WIN may be coupled to the upper module UM by the adhesive layer ADL. For example, the window WIN may be coupled to the optical layer OPL by the adhesive layer ADL FIG. 10 illustrates a portion EA1 shown in FIG. 3.

Referring to FIGS. 1 through 10, the transmission area TA may include a penetration area PTA and a second area SA surrounding the penetration area PTA. The penetration area PTA may be substantially the same as the first area FA described with reference to FIGS. 3 to 5. The penetration area PTA may be an area overlapping the sensor part SR inserted through the through hole TH, and the second area SA may surround the penetration area PTA without overlapping the portion of the sensor part SR disposed within the through hole TH.

At least one groove GRV1 and/or GRV2 surrounding the through hole TH may be provided in the second area SA. For example, the at least one groove GRV1 and/or GRV2 may include a first groove GRV1 and a second groove GRV2, which are disposed to be spaced apart from each other. The first groove GRV1 may be located more adjacent to the display area DA than the second groove GRV2 in the second area SA, and the second groove GRV2 may be located more adjacent to the through hole TH than the first groove GRV1 in the second area SA.

The first and second grooves GRV1 and GRV2 may block infiltration of oxygen or moisture, which might be introduced to the display area DA from the transmission area TA, thereby reducing or preventing damage of elements such as the pixels PXL disposed in the display area DA. The first and second grooves GRV1 and GRV2 may be formed as at least a portion of the substrate SUB is removed. For example, the first and second grooves GRV1 and GRV2 may be formed as at least a portion of the substrate SUB is removed in a direction toward a bottom surface from a top surface of the substrate SUB. When viewed on a plane, the first and second grooves GRV1 and GRV2 may be disposed in a closed curve or a ring shape, which is located in the transmission area TA and surrounds the through hole TH.

In addition, a dam part DAM may be disposed in the second area SA. The dam part DAM may be disposed between the first groove GRV1 and the second groove GRV2 in the second area SA, but the position of the dam part DAM is not limited thereto. For example, the dam portion DAM may be surrounded by the first grove GRV1 if the first groove is present, or may surround the second groove GRV2 if the second groove is present, without limitation thereto.

The dam part DAM may be formed in a stacked structure including a plurality of insulating layers, or may have a single-layer structure. The dam part DAM may define an area in which the second encapsulation layer ENC2, configured with an organic layer in the thin film encapsulation layer, TFE is disposed.

Figure 11:
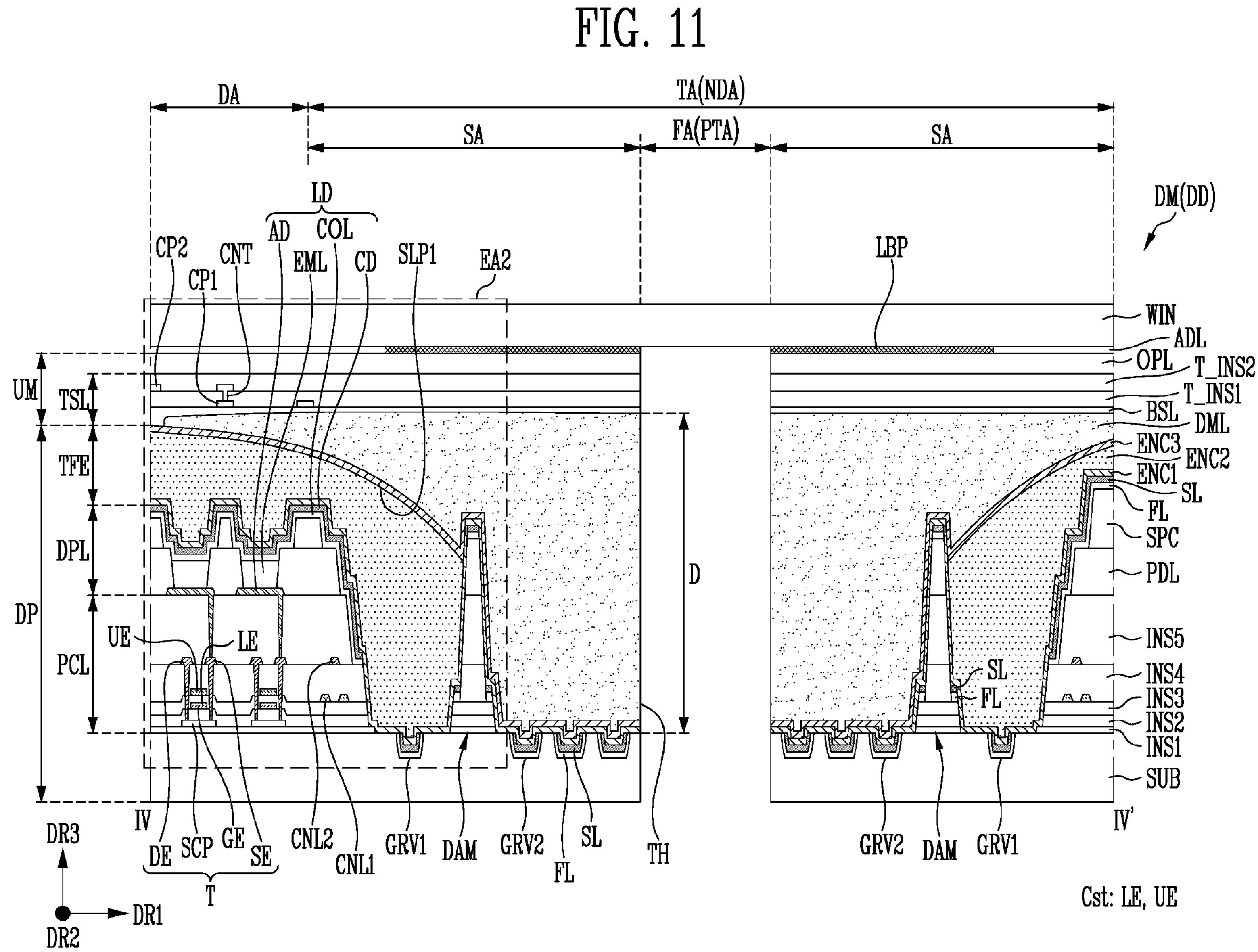
FIG. 11 is a schematic cross-sectional view diagram taken along line IV-IV' shown in FIG. 10.

FIG. 11 illustrates a cross-sectional view taken along line IV-IV' shown in FIG. 10. FIGS. 12 to 15 illustrate examples of a portion EA2 shown in FIG. 11.

Figure 12:
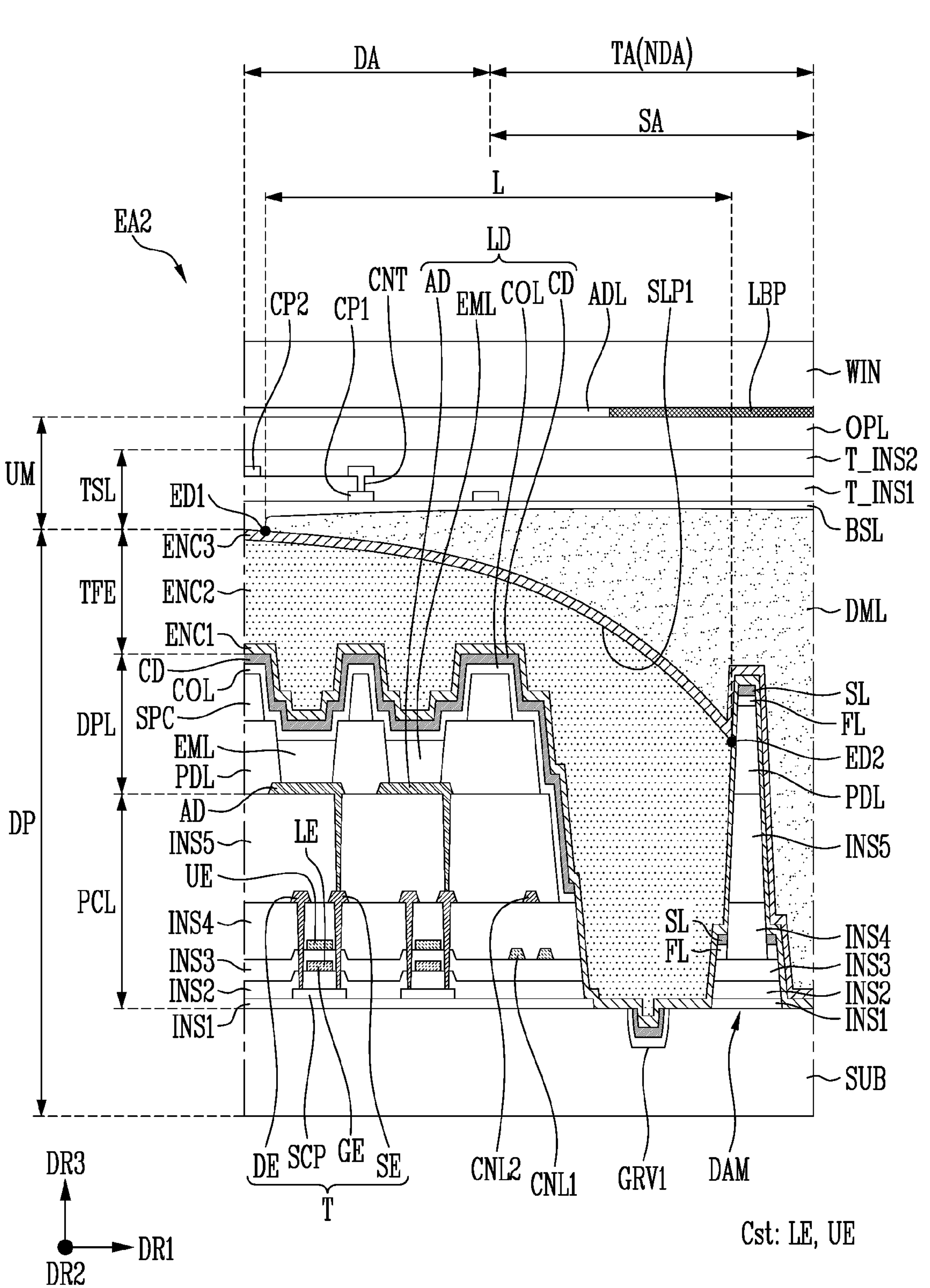
FIGS. 12 to 15 are schematic enlarged cross-sectional view diagrams illustrating a portion EA2 shown in FIG. 11.
Figure 13:
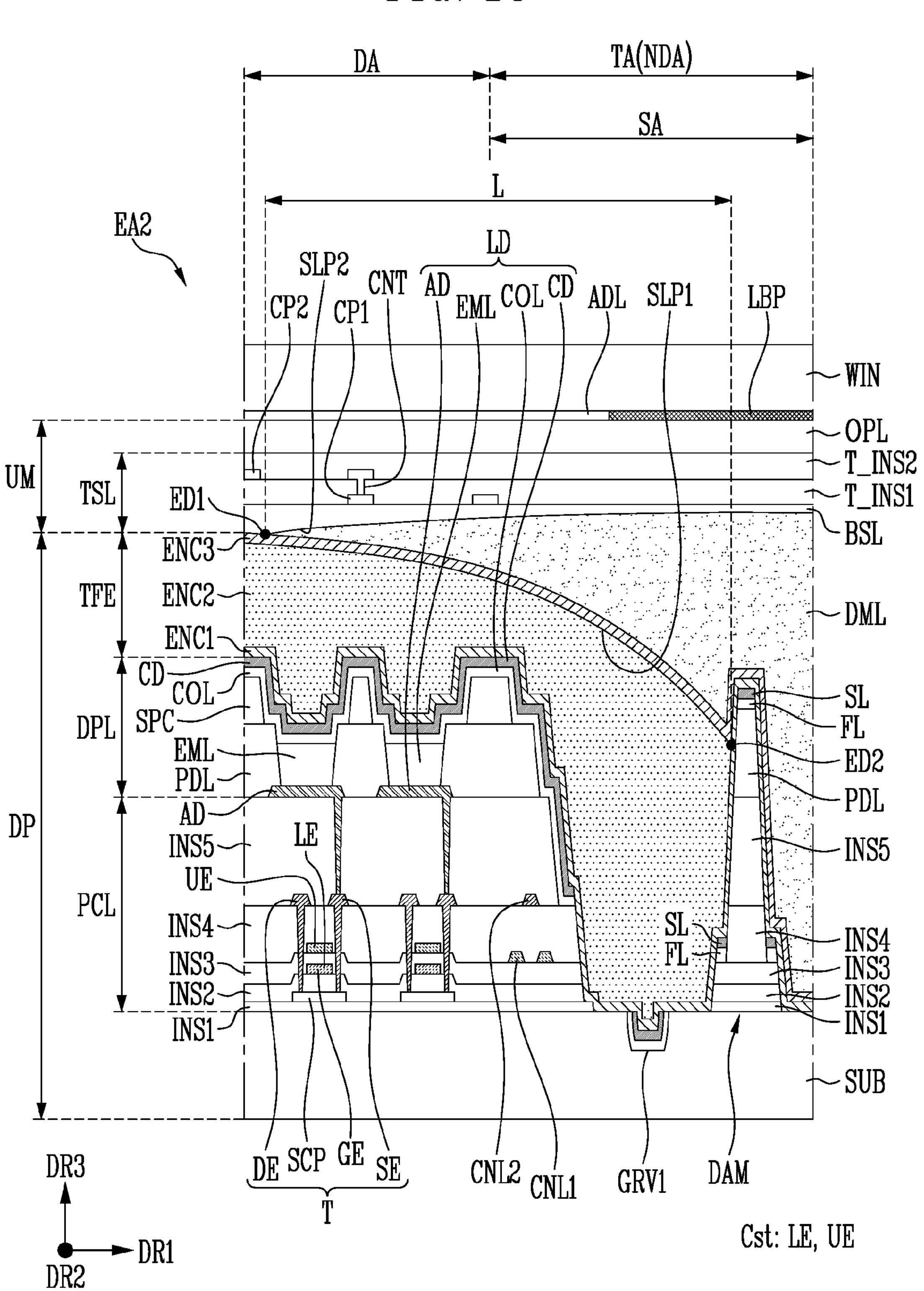
Figure 14:
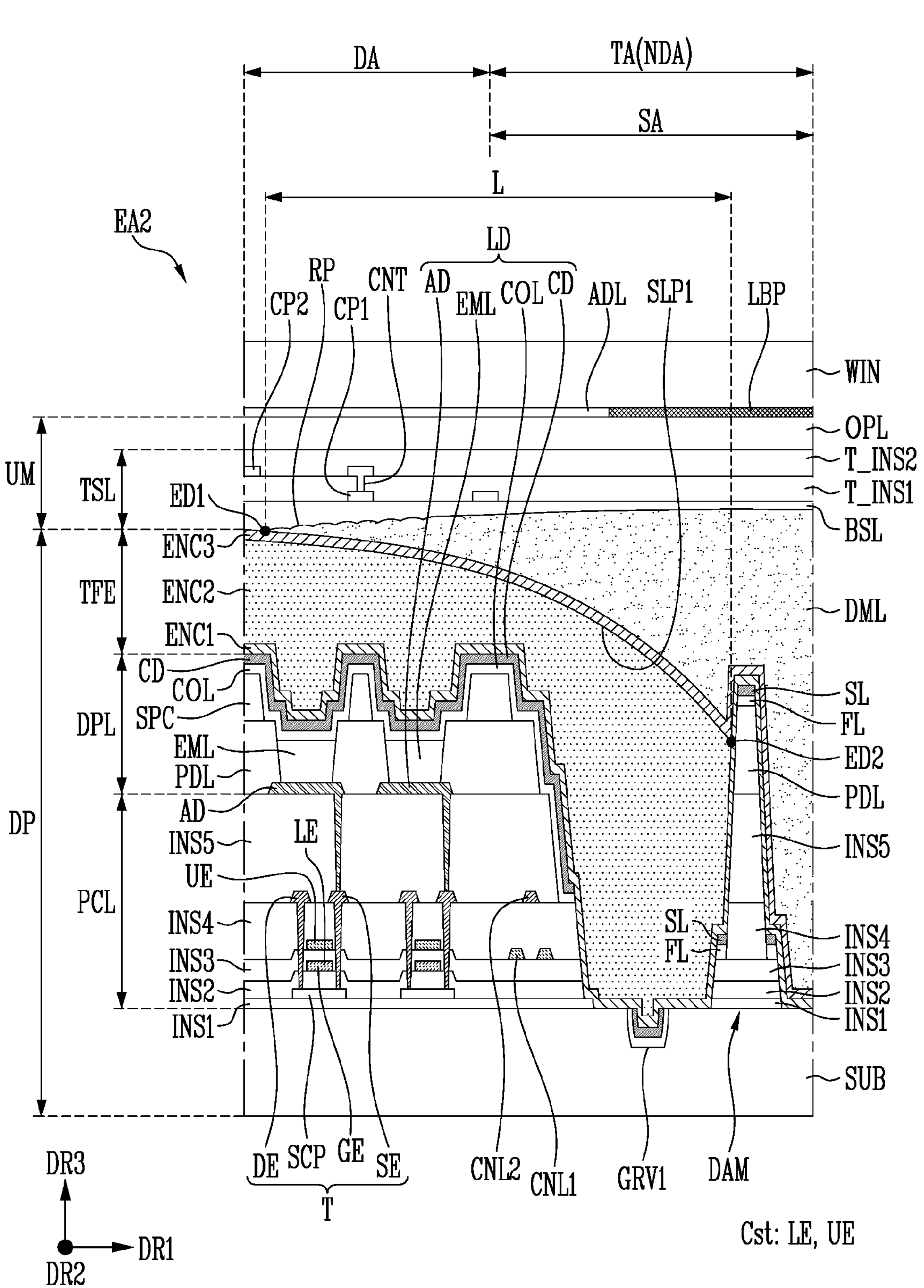
Figure 15:
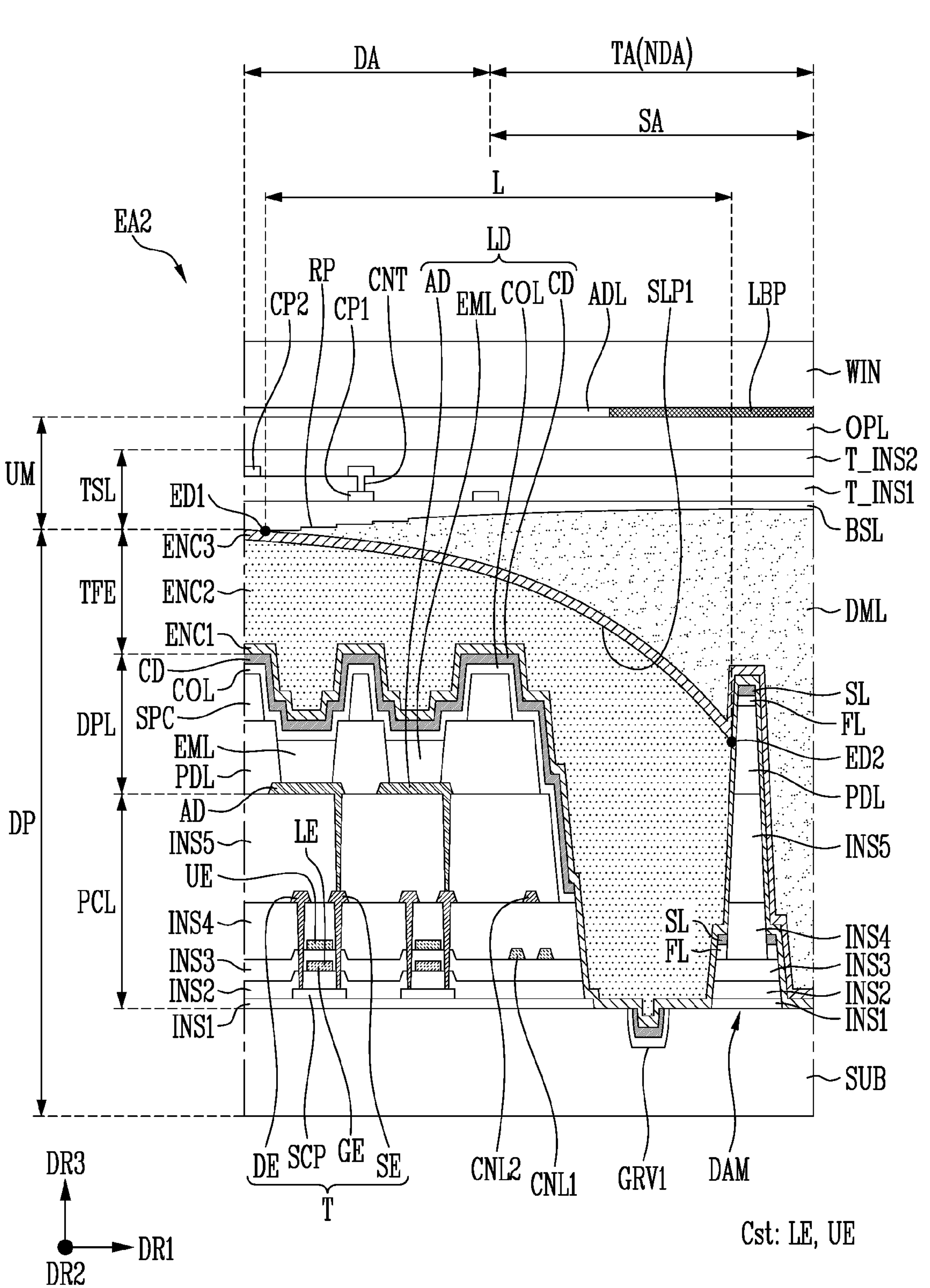

Embodiments shown in FIGS. 13 to 15 illustrate modified examples of the embodiment of FIG. 12 with respect to at least the shape of an outer edge portion ED1 of a dummy layer DML.

In relation to embodiments shown in FIGS. 11 to 15, portions different from those of the above-described embodiment will be mainly described, and substantially duplicate description may be omitted to avoid redundancy.

Referring to FIGS. 1 through 15, illustrative overlapping relationships between components of the display module DM (or the display device DD) and the transmission area TA are presented.

The display module DM (or the display device DD) may include a display panel DP, an upper module UM, and a window WIN, which are sequentially disposed along the third direction DR3.

The display panel DP may include a plurality of insulating layers, a semiconductor pattern, a conductive pattern, and signal lines. An insulating layer, a semiconductor layer, and a conductive layer may be formed using methods such as coating and/or deposition. The insulating layer, the semiconductor layer, and the conductive layer may be selectively patterned using a method of photolithography. For example, the semiconductor pattern, the conductive pattern, the signal lines, and the like, which are included in the display panel DP, may be formed using such a method.

The display panel DP may include a substrate SUB, a pixel circuit layer PCL, a display element layer DPL, and a thin film encapsulation layer TFE.

The substrate SUB may define a display area DA in which pixels PXL are disposed to display an image, a non-display area NDA in which no image is displayed, and a transmission area TA which may be defined as included in a portion of the non-display area NDA surrounded by the display area DA, thereby overlapping the sensor part (see, e.g., "SR" shown in FIG. 5). The transmission area TA may include a first area FA (or a penetration area PTA) including a through hole TH into which a portion of the sensor part SR is inserted, and a second area SA located at the periphery of the first area FA.

The pixels PXL, including the pixel circuit layer PCL and the display element layer DPL, may be disposed in the display area DA of the substrate SUB. The pixels PXL need not be disposed in the non-display area NDA or the transmission area TA, without limitation thereto.

The pixel circuit layer PCL may include a transistor T, first to fifth insulating layers INS1 to INS5, a storage capacitor Cst, and the like. The transistor T may include a semiconductor pattern SCP, a gate electrode GE, a source electrode SE, and a drain electrode DE.

The display element layer DPL may be disposed on the fifth insulating layer INS5, and include a light-emitting element LD electrically connected to the transistor T. The light-emitting element LD may include a first electrode AD, a light-emitting layer EML, a control layer COL, and a second electrode CD.

The display element layer DPL may include a pixel defining layer PDL defining an emission area of each of the pixels PXL and a spacer SPC disposed on the pixel defining layer PDL. The spacer SPC may include an organic insulating material such as a polyimide. In an embodiment, the spacer SPC may include an inorganic insulating material or include an organic insulating material and an inorganic insulating material. The spacer SPC may include a material different from a material of the pixel defining layer PDL, or may include substantially the same material as the pixel defining layer PDL. When the spacer SPC includes substantially the same material as the pixel defining layer PDL, the spacer SPC and the pixel defining layer PDL may be formed together in a mask process using a halftone mask or the like.

The thin film encapsulation layer TFE may be disposed over the second electrode CD. The thin film encapsulation layer TFE may be commonly provided to the pixels PXL. The thin film encapsulation layer TFE may directly cover the second electrode CD. The thin film encapsulation layer TFE may be located throughout the display area DA and at least a portion of the non-display area NDA. The thin film encapsulation layer TFE may include a first encapsulation layer ENC1, a second encapsulation layer ENC2, and a third encapsulation layer ENC3.

The sensor part (see, e.g., "SR" as shown in FIG. 5) including electronic elements such as a camera module and a sensor module may be disposed under the substrate SUB (or in the opposite direction of the third direction DR3) to overlap the transmission area TA. For example, a lens of the camera module may be disposed to overlap the first area FA (or the penetration area PTA) of the transmission area TA. The first area FA may have an area equal to or greater than an area of the camera module.

First and second grooves GRV1 and GRV2 may be provided in the substrate SUB. The first and second grooves GRV1 and GRV2 may be disposed in the second area A2 of the transmission area TA. Each of the first and second grooves GRV1 and GRV2 may have a shape concavely recessed from a top surface of the substrate SUB, without limitation thereto. The first and second grooves GRV1 and GRV2 may be formed to a depth in which the first and second grooves GRV1 and GRV2 do not penetrate the substrate SUB. The first groove GRV1 may be disposed between a dam part DAM and the display element layer DPL, and the second groove GRV2 may be located between the dam part DAM and a side surface of a dummy layer DML defining the through hole TH. In an embodiment, the first groove GRV1 may be omitted. The first and/or second grooves GRV1 and/or GRV2 may block an infiltration path of external moisture or oxygen, thereby preventing damage of the pixels PXL provided in the display area DA. A first layer FL and a second layer SL may be disposed in or on the first and second grooves GRV1 and GRV2. The first layer FL may include substantially the same material as the control layer COL included in the light-emitting element LD, and may be formed through substantially the same process as the control layer COL. The second layer SL may include substantially the same material as the second electrode CD included in the light-emitting element LD, and may be formed through substantially the same process as the second electrode CD. The first layer FL, which may include substantially the same material as the control layer COL including an organic material, may be interrupted between each of the first and second grooves GRV1 and GRV2, without limitation thereto. Accordingly, a defect or the like, which may occur as external moisture or the like is introduced into the light-emitting element LD of the display area DA, may be mitigated, reduced or prevented.

The display panel DP may include signal lines CNL1 and CNL2 disposed in the second area SA of the transmission area TA. The signal lines CNL1 and CNL2 may bypass the first area FA (or the penetration area PTA). The signal lines CNL1 and CNL2 may include a first signal line CNL1 and a second signal line CNL2, which may be disposed in different layers. One of the first and second signal lines CNL1 and CNL2 may be the first scan line SC1 as described with reference to FIG. 6, and the other of the first and second signal lines CNL1 and CNL2 may be the first data line DL1 as described with reference to FIG. 6. The first signal line CNL1 may be provided and/or formed on the third insulating layer INS3, and the second signal line CNL2 may be provided and/or formed on the fourth insulating layer INS4. However, the present disclosure is not limited thereto.

The display panel DP may further include the dam part DAM disposed on the substrate SUB in the second area SA. The dam part DAM may be formed in or on the substrate SUB, and may have a single layer or a stacked structure including a plurality of insulating layers. For example, the dam part DAM may have a multi-layer structure including the first insulating layer INS1, the second insulating layer INS2, the third insulating layer INS3, the fourth insulating layer INS4, the fifth insulating layer INS5, and the pixel defining layer PDL, which are sequentially stacked along the third direction DR3. The dam part DAM may further include the first layer FL and the second layer SL, which are respectively disposed on the first and second grooves GRV1 and GRV2, but the present disclosure is not limited thereto. In an embodiment, the dam part DAM may have a multi-layer structure including the spacer SPC disposed on the pixel defining layer PDL.

The dam part DAM may prevent a monomer such as a liquid organic material from being deposited up to the first area FA (or the penetration area PTA) defined by the through hole TH in a process of forming an organic layer, such as but not limited to the second encapsulation layer ENC2 included in the thin film encapsulation layer TFE. The dam part DAM may define an area in which the second encapsulation layer ENC2 of the thin film encapsulation layer TFE is disposed. For example, the dam part DAM may control the flow of the monomer, thereby defining a position at which the second encapsulation layer ENC2 is formed. Although a case where one dam part DAM disposed in the second area SA is illustrated, the present disclosure is not limited thereto. In an embodiment, at least two dam parts DAM may be disposed in the second area SA.

Moreover, in an embodiment, a reinforcing member may be further disposed in the second area SA, such as to absorb external impact. For example, the reinforcing member may be located between the dam part DAM and the through hole TH, without limitation thereto.

The substrate SUB may be opened to include the through hole TH corresponding to the first area FA. In an embodiment, the through hole TH may have a larger diameter adjacent to the substrate SUB than adjacent to the window WIN, such as to accommodate a larger diameter base of the sensor SR.

The thin film encapsulation layer TFE may be located throughout the display area DA and a portion of the non-display area NDA. The thin film encapsulation layer TFE need not be located in the penetration area PTA or first area FA.

The first encapsulation layer ENC1 of the thin film encapsulation layer TFE may be located throughout the display area DA and at least a portion of the non-display area NDA. The first encapsulation layer ENC1 may be located throughout the display area DA and the second area SA of the transmission area TA, which is adjacent to the display area DA. The first encapsulation layer ENC1 may be configured as an inorganic layer. In the display area DA, the first encapsulation layer ENC1 may be disposed over the second electrode CD, without limitation thereto, to cover the light-emitting element LD including the second electrode CD. In the second area SA, the first encapsulation layer ENC1 may be disposed over side surfaces of the first to fifth insulating layers INS1 to INS5 included in the pixel circuit layer PCL, the second electrode CD extending to the second area SA, the dam part DAM, the substrate SUB, and the first and second grooves GRV1 and GRV2, such as to cover or seal the above-described components. The first encapsulation layer ENC1 may be opened to include the through hole TH, corresponding to the first area FA.

The second encapsulation layer ENC2 of the thin film encapsulation layer TFE may be configured with an organic layer, and be located throughout the display area DA and at least a portion of the non-display area NDA. The second encapsulation layer ENC2 may be disposed throughout the display area DA and a portion of the second area SA of the transmission area TA, which is adjacent to the display area DA. In the display area DA, the second encapsulation layer ENC2 may be disposed on the first encapsulation layer ENC1. In the second area SA, the second encapsulation layer ENC2 may be in contact with the dam part DAM. An inner edge portion ED2 of the second encapsulation layer ENC2 may overlap a light blocking pattern LBP, but the present disclosure is not limited thereto. The second encapsulation layer ENC2 need not be deposited in the first area FA, but may be sealed by the dam part DAM and the third encapsulation layer ENC3 disposed on the damp part DAM. Thus, external moisture, external oxygen, and the like may be substantially prevented from being introduced to the light-emitting element LD of the display element layer DPL through the first area FA (or the penetration area PTA), and damage of the light-emitting element LD may be mitigated, reduced or prevented.

In an embodiment, the second encapsulation layer ENC2 may overlap the second area SA, and include a first sloped part SLP1 (or first inclined surface) defining the first area FA (or penetration area PTA) in the transmission area TA, such as by defining a horizontal circumference substantially parallel to the DR1-DR2 plane where an imaginary extension of the first sloped part SLP1 may approximately intersect the substrate SUB. A height of the first sloped part SLP1 with respect to the top surface of the substrate SUB may become smaller as it approaches the dam part DAM. The first sloped part SLP1 may include the inner edge portion ED2 in contact with the dam part DAM in the second area SA.

The third encapsulation layer ENC3 of the thin film encapsulation layer TFE may be located throughout the display area DA and at least a portion of the non-display area NDA. The third encapsulation layer ENC3 may be located throughout the display area DA and the second area SA of the transmission area TA, which is adjacent to the display area DA. The third encapsulation layer ENC3 may be configured with an inorganic layer. In the display area DA, the third encapsulation layer ENC3 may be disposed over the second encapsulation layer ENC2, such as to seal the second encapsulation layer ENC2. In the second area SA, the third encapsulation layer ENC3 may be disposed over the second encapsulation layer ENC2, the first encapsulation layer ENC1 on the dam part DAM, the substrate SUB, and the first and second grooves GRV1 and GRV2 such as to cover or seal the above-described components. The third encapsulation layer ENC3 may be opened to include the through hole TH, corresponding to the first area FA (or penetration area PTA).

In the second area SA, the dummy layer DML may be disposed on the third encapsulation layer ENC3 (or the thin film encapsulation layer TFE). The dummy layer DML may include a transparent organic material. In an example, the dummy layer DML may be configured with a transparent organic material capable of reducing a step difference caused by components located on the bottom thereof while having substantially no influence on an advancing path of light incident into the sensor part SR overlapping the first area FA (or penetration area PTA).

The dummy layer DML may have a thickness D in a thickness direction of the substrate SUB (or the third direction DR3), and the thickness D of the dummy layer DML may become thinner as it approaches the display area DA from the through hole TH. The thickness of the dummy layer DML adjacent to the first area FA may be approximately 11 μm to approximately 12 μm or so, but the present disclosure is not limited thereto. For example, the dummy layer DML may be coated to have a thickness D of approximately 10 μm or more in an area adjacent to the first area FA. The dummy layer DML need not overlap the through hole TH, and may be entirely located in the second area SA of the transmission area TA.

In an embodiment, the dummy layer DML may be located throughout the second area SA and a transition area of the display area DA, which transition area is adjacent to the second area SA. The dummy layer DML may extend from the second area SA to the transition area of the display area DA, which is immediately adjacent to the second area SA, to be disposed on the thin film encapsulation layer TFE located over a plurality of pixels PXL located in the transition area of the display area DA. The outer edge portion ED1 of the dummy layer DML may be located on the third encapsulation layer ENC3 of the display area DA, which is spaced apart from the inner edge portion ED2 of the first sloped part SLP1 at a first distance L. The first distance L may be approximately 2000 μm to approximately 2500 μm or so, but the present disclosure is not limited thereto. The first distance L may mean a distance from a point at which the first sloped part SLP1 is started to the inner edge portion ED2 of the first sloped part SLP1. The point at which the first sloped part SLP1 is started may correspond to the outer edge portion ED1 of the dummy layer DML, but the present disclosure is not limited thereto.

A base layer BSL of a touch sensor layer TSL may be entirely disposed over the dummy layer DML of the second area SA, the dummy layer DML extending into the display area DA, and the third encapsulation layer ENC3 of the horizontal portion of the display area DA on which the dummy layer DML is not located. The base layer BSL may cover the dummy layer DML and the third encapsulation layer ENC3.

A first conductive pattern CP1 may be disposed on the base layer BSL. In an example, the first conductive layer CP1 may include the first bridge patterns BRP1 such as described above with reference to FIGS. 8 and 9.

A first touch insulating layer T_INS1 may be provided and/or formed over the first conductive pattern CP1. The first touch insulating layer T_INS1 may be partially opened to include a contact part CNT exposing a portion of the first conductive pattern CP1.

A second conductive pattern CP2 may be disposed on the first touch insulating layer T_INS1. For example, the second conductive pattern CP2 may include the first and second sensing electrodes SSE1 and SSE2 and the second bridge patterns BRP2, such as described above with reference to FIGS. 8 and 9.

A second touch insulating layer T_INS2 may be provided and/or formed over the second conductive pattern CP2. The second touch insulating layer T_INS2 may cover the second conductive pattern CP2.

An optical layer OPL may be disposed on the second touch insulating layer T_INS2. The optical layer OPL may cover the display area DA and the second area SA, but need not cover the first area FA (or penetration area PTA).

The window WIN may be disposed on the optical layer OPL. The window WIN may cover the display area DA, and at least part of the Non-display area NDA including at least both the second area SA and the first area FA (or penetration area PTA) of the transmission area TA.

An adhesive layer ADL may be disposed between the optical layer OPL and the window WIN in the display area DA, and the light blocking pattern LBP may be disposed between the optical layer OPL and the window WIN in the second area SA of the transmission area TA. The light blocking pattern LBP need not overlap the first area FA, and may include a material for blocking or absorbing light. For example, the light blocking pattern LBP may include a black matrix. The light blocking pattern LBP may block or absorb external light, thereby reducing or preventing the sensor part (see, e.g., "SR" shown in FIG. 5) inserted into the through hole TH from being viewed by a user due to illumination by such external light.

In accordance with the above-described embodiment of FIG. 12, the dummy layer DML may be a step difference compensation member which covers the first sloped part SLP1 of the second encapsulation layer ENC2, thereby reducing a step difference caused by the first sloped part SLP1. The second encapsulation layer ENC2 may include the first sloped part SLP1 having a height which becomes smaller as it approaches the dam part DAM. Accordingly, a step difference may be reduced, compared to the embodiment of FIG. 5, between the display area DA in an area in which the second encapsulation layer ENC2 is located, and the second area SA of the transmission area TA.

In an embodiment, the dam part DAM part is annular and the dummy layer DML has a vortex shape, without limitation thereto. For example, in a plan view, the dam part and/or dummy layer may be oval, bulbous, globular, gear-shaped, sun-shaped, sprocket-shaped, triangular, quadrilateral, star-shaped, polygonal, or a combination thereof. Moreover, the dam part may have a shape different from the dummy layer in a plan view, such as a doughnut shaped dam part and a sprocket-shaped dummy layer. In addition, at least the dummy layer and transition area of the display area may be elongated in one direction and/or compressed in another direction, such as a vertically or horizontally aligned oval shape, depending on the application and/or anticipated direction of incoming external light.

In a case in which external light is incident, a difference between an external light reflexibility in the display area DA and an external light reflexibility in the second area SA may yet occur due to a step difference of components disposed in the second area SA and components disposed in the display area DA adjacent to the second area SA. Due to such an external light reflexibility difference, external light might still be undesirably reflected and viewed by a user at a boundary point between the display area DA and the second area SA.

In the above-described embodiment of FIG. 12, the dummy layer DML is disposed in the second area SA and in a transition area of the display area DA, which is adjacent to the second area SA, so that a relatively flat surface can be provided at an upper portion by covering components located in the second area SA and components located in the transition area of the display area DA. For example, in an embodiment, the dummy layer DML having a relatively flat surface may be disposed on the third encapsulation layer ENC3 in the second area SA and the third encapsulation layer ENC3 in a transition area of the display area DA, which is an area adjacent to the second area SA. As the dummy layer DML is disposed throughout the second area SA and the transition area of the display area DA, a step difference occurring between the second area SA and the display area DA can be compensated by the first sloped part SLP1. An external light reflexibility difference may be reduced between reflexibility in the second area SA and reflexibility in the display area DA, which may become substantially similar or equal to each other. Thus, a non-optimal visual effect, in which reflected external light is undesirably viewed at a boundary point between the second area SA and the display area DA, may be further reduced compared to the embodiment of FIG. 5. Accordingly, the reliability of the display module DM (or the display device DD) can be optimized.

Moreover, in the above-described embodiment of FIG. 12, as the dummy layer DML is disposed throughout the second area SA and the transition area of the display area DA, which is adjacent to the second area SA, a relatively flat surface is provided at an upper portion, so that the step coverage of components (or upper members) disposed in the second area SA2 and in the transition area of the display device DA, such as the base layer BSL of the touch sensor layer TSL, can be optimized.

Although a case where the dummy layer DML has a relatively sharp slope toward the outer edge portion ED1 thereof, which is located in the transition area of the display area DA, is illustrated in FIG. 12, the present disclosure is not limited thereto. In an embodiment, as shown in FIG. 13, the dummy layer DML may have a relatively gentle second sloped part SLP2 (or second inclined surface) at which the thickness D of the dummy layer DML gradually decreases toward the outer edge portion ED1 of the dummy layer DML. In a case where the dummy layer DML has the gentle second sloped part SLP2 toward the outer edge portion ED1 thereof, a top surface of the third encapsulation layer ENC3 on which the dummy layer DML is not located in the display area DA, and a top surface of the dummy layer DML disposed on the third encapsulation layer ENC3 in the display area DA adjacent to the second area SA, may have degrees of flatness substantially similar to each other. In an example, the top surface of the third encapsulation layer ENC3, on which the dummy layer DML is not disposed in the display area DA, may be located on a line similar to a line on which is located the top surface of the dummy layer DML disposed on the third encapsulation layer ENC3 in the display area DA adjacent to the second area SA. Alternatively, the top surface of the third encapsulation layer ENC3, on which the dummy layer DML is not disposed in the display area DA, may be located on substantially the same line as the top surface of the dummy layer DML disposed on the third encapsulation layer ENC3 in the display area DA adjacent to the second area SA. Thus, substantially the same relatively flat surface may be provided on the tops of components disposed in the display area DA in which the dummy layer DML is not located, and tops of components disposed in the transition area of the display area DA, in which the dummy layer DML is located. Moreover, similar relatively flat surfaces may be respectively provided on the tops of the components disposed in the display area DA in which the dummy layer DML is not located, and the tops of components disposed in the transition area of the display area DA, in which the dummy layer DML is located. Thus, an external light reflexibility difference which may occur between the display area DA and the transition area of the display area can be mitigated, reduced or prevented.

In the embodiments as shown in FIGS. 14 and 15, respectively, the dummy layer DML may include at least one uneven pattern RP located adjacent to the outer edge portion ED1 thereof.

The uneven pattern RP may be patterned using a multi-slit mask or the like, which uses slits, in a process of forming the dummy layer DML on the third encapsulation layer ENC3, so that a thickness D at the outer edge portion ED1 of the dummy layer DML and a thickness D of the dummy layer DML adjacent to the outer edge portion ED1 are different from each other. For example, the uneven pattern RP may be provided such that the top surface of the third encapsulation layer ENC3 on which the dummy layer DML is not located in the display area DA and the top surface of the dummy layer DML located on the third encapsulation layer ENC3 in the display area DA adjacent to the second area SA have a relatively flat surface.

In an embodiment, the uneven pattern RP may be selectively provided so as to reduce or minimize external light reflection which may occur at a boundary point between the outer edge portion ED1 of the dummy layer DML and the third encapsulation layer ENC on which the dummy layer DML is not located.

In an embodiment, the uneven pattern RP may have various shapes. In an example, as shown in FIG. 14, the uneven pattern RP may have an embossed or wave shape including protrusion parts protruding upward along the third direction DR3 from the top surface of the dummy layer DML and valleys disposed between the protrusion parts, but the present disclosure is not limited thereto. In an embodiment, the uneven pattern RP may have a stepped shape as shown in FIG. 15. The shape of the uneven pattern RP may be variously changed by adjusting a distance between slits of the multi-slit mask, a size of the slits, and the like. In each of FIGS. 14 and 15, it is illustrated that uneven patterns RP have substantially the same shape along the DR1 direction. However, the present disclosure is not limited thereto.

In an embodiment, the uneven pattern RP may have a finely waved shape closer to the second area SA and a finely stepped shape closer to the outer edge portion ED1, or vice versa. For example, the uneven pattern RP may have a longer period (or lower frequency) shape closer to the second area SA tapering down to a shorter period (or higher frequency) shape closer to the outer edge portion ED1, or vice versa.

In accordance with an embodiment of the present disclosure, a display device may have a dummy layer provided therein, which covers a sloped part of a thin film encapsulation layer and extends up to a portion of a display area. An external light reflexibility difference may be minimized between the display area and an area having a camera module or the like, thereby optimizing the reliability of the display device.

The inventive concept has been described by way of example with respect to embodiments thereof. Although illustrative embodiments have been disclosed herein, and although specific terms are employed, such terms and embodiments are used and shall be interpreted in a broadly descriptive sense without limitation. In some instances, as would be apparent to one of ordinary skill in the pertinent art as of the filing of the present application, various features, characteristics, and/or elements described in connection with a particular embodiment may be used singly or in combination with other features, characteristics, and/or elements described in connection with other embodiments, unless otherwise specifically indicated. Accordingly, it shall be understood that various changes in form and details may be made without departing from the spirit and scope of the present disclosure as set forth in the following claims.

What is claimed is:

1. A display device comprising:

a substrate including a transmission area having a first area in which a through hole is defined, a second area surrounding the first area, and a display area surrounding the transmission area;

a display element layer disposed on the substrate in the display area;

a dam part provided in the second area of the transmission area, the dam part being spaced apart from the display element layer;

a thin film encapsulation layer disposed on the display element layer, the thin film encapsulation layer including a first sloped part having a height which becomes smaller as it approaches the dam part in the second area of the transmission area; and a dummy layer covering the first sloped part of the thin film encapsulation layer in the second area of the transmission area, the dummy layer including an outer edge portion extending into the display area adjacent to the second area.

2. The display device of claim 1, wherein the dummy layer includes a transparent organic material, wherein the dummy layer has a vortex shape.

3. The display device of claim 1, wherein the thin film encapsulation layer includes:

a first encapsulation layer disposed on the display element layer;

a second encapsulation layer disposed on the first encapsulation layer; and a third encapsulation layer disposed on the second encapsulation layer, wherein the second encapsulation layer is an organic layer, and the first and third encapsulation layers are inorganic layers, and wherein the first sloped part is formed by the second encapsulation layer.

4. The display device of claim 3, wherein the first sloped part includes an inner edge portion in contact with the dam part in the second area of the transmission area, and wherein the outer edge portion of the dummy layer is located on the third encapsulation layer of the display area, which is spaced apart from the inner edge portion of the first sloped part at a first distance.

5. The display device of claim 4, wherein the first distance is about 2000 μm to about 2500 μm.

6. The display device of claim 4, wherein the dummy layer has a thickness which becomes thinner as it approaches the outer edge portion.

7. The display device of claim 4, wherein the dam part defines an area in which the second encapsulation layer is disposed, wherein the dam part has an annular shape.

8. The display device of claim 1, wherein at least one transition area of the dummy layer has a second sloped part having a thickness which becomes thinner as it approaches the outer edge portion.

9. The display device of claim 1, wherein at least one transition area of the dummy layer includes at least one wave pattern in a direction toward the outer edge portion.

10. The display device of claim 1, wherein at least one transition area of the dummy layer has a stepped shape in a direction toward the outer edge portion.

11. The display device of claim 1, further comprising a touch sensor layer disposed on at least one of the thin film encapsulation layer or the dummy layer, wherein the touch sensor layer includes:

a base layer disposed on the thin film encapsulation layer in the display area and the dummy layer in the transmission area;

a first conductive pattern disposed on the base layer;

a first touch insulating layer disposed over the first conductive pattern;

a second conductive pattern disposed on the first touch insulating layer; and a second touch insulating layer disposed over the second conductive pattern.

12. The display device of claim 11, further comprising:

an optical layer disposed on the touch sensor layer;

a window disposed on the optical layer, and a light blocking pattern disposed on the bottom of the window in the second area of the transmission area, the light blocking pattern overlapping the dam part and the dummy layer, wherein the light blocking pattern includes a black matrix.

13. The display device of claim 1, further comprising:

a pixel circuit layer disposed between the substrate and the display element layer, wherein the pixel circuit layer includes first, second, third, fourth, and fifth insulating layers sequentially disposed on the substrate, at least one transistor disposed on the first insulating layer, and signal lines electrically connected to the transistor, and wherein the display element layer includes a pixel defining layer disposed on the pixel circuit layer and a light-emitting element which is disposed on the pixel circuit layer and is electrically connected to the transistor.

14. The display device of claim 13, wherein the dam part includes at least one of the first insulating layer, the second insulating layer, the third insulating layer, the fourth insulating layer, the fifth insulating layer, and the pixel defining layer.

15. The display device of claim 13, wherein the light-emitting element includes:

a first electrode disposed on the pixel circuit layer, the first electrode having a portion exposed by an opening of the pixel defining layer;

a light-emitting layer disposed on the first electrode; and a second electrode disposed on the light-emitting layer.

16. The display device of claim 1, further comprising:

a groove concavely recessed toward the substrate, corresponding to the transmission area.

17. The display device of claim 1, further comprising a sensor part overlapping the through hole of the transmission area.

18. A display device comprising:

a display panel;

a touch sensor layer disposed on the display panel; and a window disposed on the touch sensor layer, wherein the display panel includes:

a substrate including a transmission area including a first area in which a through hole is defined and a second area surrounding the first area, and a display area surrounding the transmission area;

a display element layer provided on the substrate in the display area, the display element layer including a light-emitting element;

a dam part provided in the second area of the transmission area, the dam part being spaced apart from the display element layer;

a thin film encapsulation layer disposed on the display element layer, the thin film encapsulation layer having a sloped part having a height which becomes smaller as it approaches the dam part in the second area of the transmission area; and a dummy layer covering the sloped part of the thin film encapsulation layer in the second area of the transmission area, the dummy layer including an outer edge portion located in the display area adjacent to the second area, wherein the sloped part includes an inner edge portion in contact with the dam part in the second area of the transmission area, and wherein the outer edge portion of the dummy layer is located on the thin film encapsulation layer of the display area, which is spaced apart from the inner edge portion of the sloped part at a first distance.

19. The display device of claim 18, wherein the first distance is about 2000 μm to about 2500 μm.

20. The display device of claim 18, wherein the thin film encapsulation layer includes:

a first encapsulation layer disposed on the display element layer;

a second encapsulation layer disposed on the first encapsulation layer; and a third encapsulation layer disposed on the second encapsulation layer, wherein the second encapsulation layer is an organic layer, and the first and third encapsulation layers are inorganic layers, and wherein the sloped part is formed by the second encapsulation layer.

* * * * *